(12) United States Patent
Anderson

(10) Patent No.: US 6,519,755 B1
(45) Date of Patent: Feb. 11, 2003

(54) METHOD AND APPARATUS FOR LOGIC SYNTHESIS WITH ELABORATION

(75) Inventor: Glen R. Anderson, Palo Alto, CA (US)

(73) Assignee: Sequence Design, Inc., Santa Clara, CA (US)

( * ) Notice: Subject to any disclaimer, the term of this patent is extended or adjusted under 35 U.S.C. 154(b) by 0 days.

(21) Appl. No.: 09/375,843

(22) Filed: Aug. 16, 1999

(51) Int. Cl.$^7$ .............................................. G06F 17/50
(52) U.S. Cl. ............................................ 716/18; 716/2
(58) Field of Search ...................... 716/18, 2

(56) References Cited

U.S. PATENT DOCUMENTS

| | | | |
|---|---|---|---|
| 5,537,580 A | * | 7/1996 | Giomi et al. ................. 716/19 |
| 5,661,661 A | | 8/1997 | Gregory et al. ............. 364/489 |
| 5,841,663 A | | 11/1998 | Sharma et al. .............. 364/490 |
| 5,937,190 A | * | 8/1999 | Gregory et al. ............. 395/704 |
| 6,212,666 B1 | * | 4/2001 | Gohl et al. ..................... 716/6 |
| 6,289,498 B1 | * | 9/2001 | Dupenloup ................... 716/18 |
| 6,295,636 B1 | * | 9/2001 | Dupenloup ................... 716/18 |

* cited by examiner

Primary Examiner—Vuthe Siek
Assistant Examiner—A. M. Thompson
(74) Attorney, Agent, or Firm—MacPherson Kwok Chen & Heid LLP; Edward C. Kwok

(57) ABSTRACT

An embodiment of the present invention is a method for logic synthesis that reduces use of computer memory and reduces computer runtime. In particular, an embodiment of the present invention is a method for logic synthesis which includes the steps of: (a) analyzing an HDL model to develop a parse tree and (b) elaborating the parse tree to create a word-oriented netlist; wherein elaborating comprises word-oriented elaborating.

12 Claims, 19 Drawing Sheets

FIG. 3B
```
module a (d,en,q);
    input d;
    input en;
    output q;
        always @ (en or d)
            if (en)
                q=d          ~— 333
endmodule
```
FIG. 3C
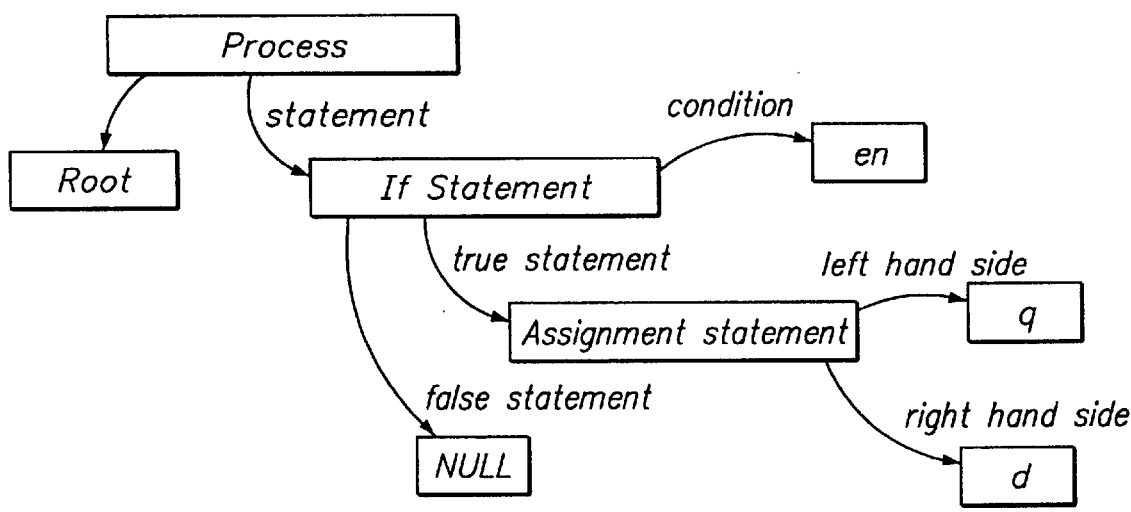
FIG. 4 Prior Art
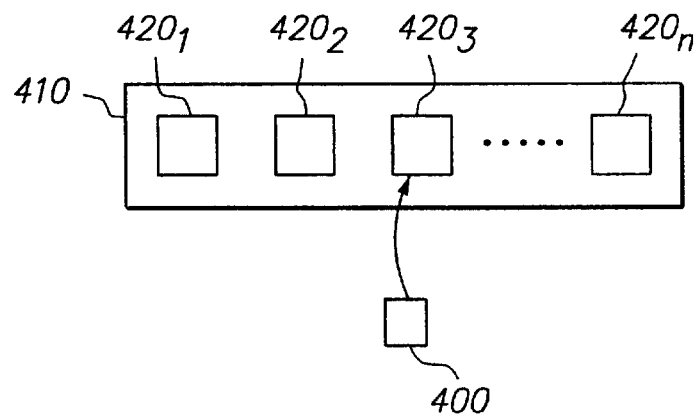

Update Object

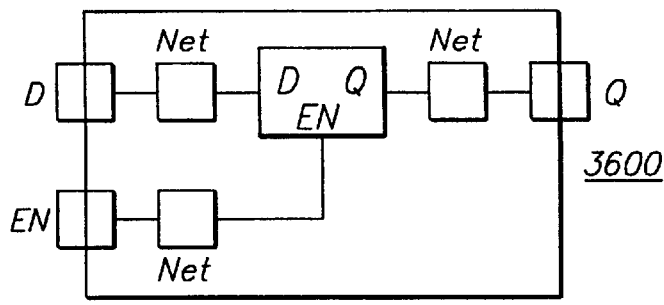
FIG. 36
```
always @ (d or en)
    if (en)
        q=d;
    else
        q='bz;
```
FIG. 37
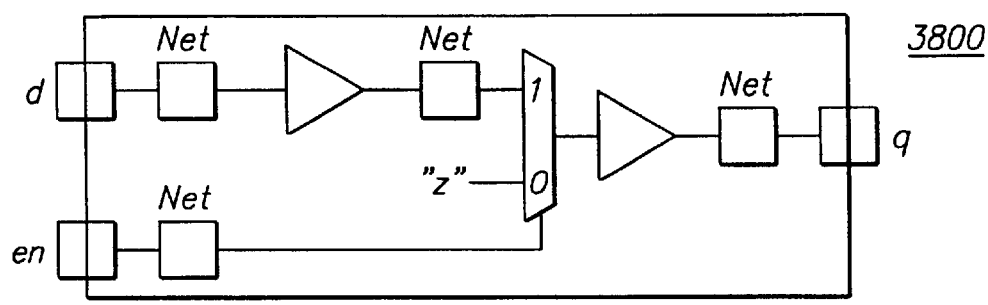
FIG. 38
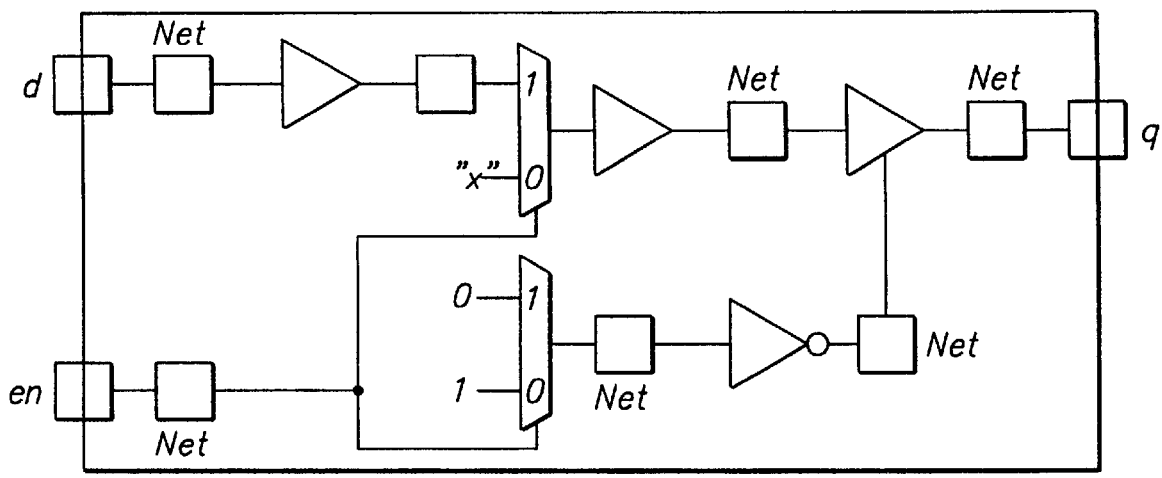
FIG. 39

METHOD AND APPARATUS FOR LOGIC SYNTHESIS WITH ELABORATION

CROSS REFERENCE TO RELATED APPLICATIONS

The present invention is related to two pending patent applications filed on Aug. 16, 1999 entitled: "Method and Apparatus for Logic Synthesis (Word Oriented Netlist)," which has been given U.S. patent application Ser. No. 09/375,836 and "Method and Apparatus for Logic Synthesis (Inferring Complex Components), which has been given U.S. patent application Ser. No. 09/375,254."

TECHNICAL FIELD OF THE INVENTION

The present invention pertains to the field of logic synthesis and, in particular, to method and apparatus for converting a hardware description language ("HDL") model of an electronic logic system to a netlist (wherein a netlist is a data structure representation of the electronic logic system that comprises a set of modules, each of which modules comprises a data structure that specifies sub-components and their interconnection).

BACKGROUND OF THE INVENTION

Automated design of application specific integrated circuits ("ASIC") as well as programming of either programmable logic devices or programmable gate arrays requires specification of a logic circuit by a designer. A hardware description language ("HDL") provides the designer with a mechanism for describing the operation of the desired logic circuit in a technology independent manner.

FIG. 1 shows a flow chart of a prior art method of logic synthesis that starts with a designer-specified HDL model of an electronic logic system and generates a Gate-Level netlist. As shown in FIG. 1, in step 100, a designer inputs a model of an electronic logic system having a desired logic functionality in the form of a set of files (HDL 10) that describe the model in a prior art HDL. As further shown in FIG. 1, in step 110, HDL 10 is parsed by a lexical analyzer and parser (lex,yacc parser 120). During parsing step 110, lex,yacc parser 120 calls routines to populate parse tree 130 (a database that is commonly referred to in the art as a parse tree). As still further shown in FIG. 1, in step 140, parse tree 130 is traversed to generate control-flow-graph 150 (CFG 150), also known in the art as a control-data-flow-graph. As yet still further shown in FIG. 1, elaboration step 160 is performed to traverse CFG 150 and populate Gate-Level Netlist 170. Gate-Level Netlist 170 is an independent and complete representation of HDL 10. It is well known to those of ordinary skill in the art how to traverse Gate-Level Netlist 170 to create a logic netlist as output.

As is well known to those of ordinary skill in the art, CFG 150 is an independent representation of the logic system (using edge and control) that is not dependent on parse tree 130 or Gate-Level Netlist 170.

In accordance with prior art logic synthesis systems, the result of elaboration step 160 is a data base, i.e., Gate-Level Netlist 170, in which each bit of a bussed net and each elaborated gate is represented by a separate data base object. Such a database is called "bit-oriented." Optionally, additional objects in Gate-Level Netlist 170 track groups of bits to indicate their association as a bus object (as indicated in the HDL model). These objects are optional because the bit-oriented representation of the HDL model, while not concise, is complete. This is illustrated in FIG. 2 which shows, in schematic form, a bussed net represented in a prior art logic netlist. As shown in FIG. 2, bussed net 300 is represented by a multiplicity of individual net objects $320_1, \ldots, 320_n$ and a separate bus net object 310 that associates these individual net objects into a bus.

Using such prior art netlists, it is easy to represent configurations in which bits of a bussed net behave differently because each net bit is broken into a separate object in the data base. However, due to the large number of such objects, such data bases require a large amount of computer memory. Additionally, it takes large computer runtimes to perform the prior art logic synthesis.

As one can readily appreciate from the above, a need exists in the art for a method and apparatus for logic synthesis that reduces use of computer memory and reduces computer runtime.

SUMMARY OF THE INVENTION

Embodiments of the present invention advantageously satisfy the above-identified need in the art and provide a method and apparatus for logic synthesis that reduces use of computer memory and reduces computer runtime.

In particular, an embodiment of the present invention is a method for logic synthesis which comprises the steps of: (a) analyzing an HDL model to develop a parse tree and (b) elaborating the parse tree to create a word-oriented netlist.

Aspects of the present invention include, without limitation: (a) an inventive Gate-Level netlist comprising word-oriented data objects (i.e., vector gate objects); (b) an inventive Gate Level netlist comprising novel connection objects; (c) a novel word-oriented (i.e., vector) elaboration method to create the inventive Gate-Level netlist; and (d) a novel method to infer complex components (for example, latches, flip-flops, multiplexors, and tristates) from a Gate-Level netlist (including the inventive Gate-Level netlist), without direction from the designer other than that contained within the designer-created HDL model.

In one embodiment of the present invention, novel connection objects "sit between" pin and net objects to create efficiency in connections represented in "G" data base. Examples of such novel connection objects include: (a) full conn; (b) bit-select conn; (c) part-select conn; (d) concat conn; (e) const conn; and (f) float conn. In particular, the novel const conn object enables efficient representation of constant logic values, for example, logic0 and logic1; the novel float conn object enables efficient representation of an undriven or floating output. Further, in accordance with the present invention, a single const conn object or a single float conn object can represent an arbitrary bit-width const or float connection and, a const conn object and a float conn object can be included in a concat conn object.

In further aspects of the present invention, the inventive elaboration method utilizes the following inventive data base constructs: (a) a chunk; (b) a cache; (c) a cache item; and (d) an update item. In addition, the inventive elaboration method comprises a novel method for dealing with exceptions.

In another embodiment of the present invention, the inventive elaboration method comprises the steps of: (a) preprocessing a parse tree; (b) recursively traversing top-level statement objects in parse tree process objects; and (c) connecting net objects in the inventive word-oriented "G" data base. In a further embodiment of the inventive elaboration method, step (b) of recursively traversing the top-level statement objects comprises the steps of: (i) setting "parent" and "previous" pointers of a statement object; (ii) creating a net object and a driver object for assignment statement objects; (iii) recursing into each sub-statement object of a statement object; and (iv) propagating cache items upwards to the statement object's "parent". In a still further embodiment of the inventive elaboration method, step of (ii) of creating a net object and a driver object for assignment statement objects comprises, for an assignment statement object, the steps of (1) creating a net object in the "G" data base which has a bit-width equal to the width of the left-hand-side of the assignment statement object; (2) creating an update object in the "V" data base (the parse tree); (3) updating the cache item of the assignment statement object with the contents of the update object to provide an updated chunk list; (4) creating a "full-conn" object in the "G" data base to the net object created in the "G" data base in the first step; (5) carrying out a "makeConn" method for the right-hand side of the assignment statement object to create conn objects; and (6) creating a buffer gate object in "G" data base with an output of the buffer object being set to a full-conn object created in the fourth step and an input of the buffer gate object being set to a conn object created in the fifth step. In a yet still further embodiment of the inventive elaboration method, step (iii) of connecting net objects in the inventive word-oriented "G" data base comprises the steps of: (1) finding a net object corresponding to the cache item's HDL identifier; (2) creating a conn object to drive the net object; (3) carrying out a "makeConn" method; and (4) creating a buffer gate object.

A further aspect of the present invention relates to a novel method for inferring complex components from a "G" data base. One embodiment of the present invention for inferring complex components is an inventive method for inferring latches that comprises the steps of: (a) traversing a gate netlist; (b) for a net, identifying (1) a net driver, (2) feedback connections and (3) associated enable signals that cause the feedback connections; and (c) substituting a latch gate as the driver of the net, the latch gate having (1) a data-input connected to the net driver, (2) an enable-input connected to the associated enable, and (3) a data-output to drive the net. Further steps include inserting don't-care conditions to replace feedback connections. Another embodiment of the present invention for inferring complex components is an inventive method for inferring tristates that comprises the steps of: (a) traversing a gate netlist; (b) for a net, identifying (1) a net driver, (2) high-impedance constant connections, and (3) associated enable signals that cause the high-impedance constant connections; and (c) substituting a tristate gate as the driver of the net, the tristate gate having (1) a data-input connected to the net driver and (2) an enable-input connected to the associated enable, and (3) a data-output to drive the net. Further steps include inserting don't-care conditions to replace high-impedance constant connections.

BRIEF DESCRIPTION OF THE FIGURE

FIG. 3B shows Verilog HDL that represents the function of a latch;

FIG. 3C shows a parse tree that corresponds to the Verilog HDL shown in FIG. 3B

FIG. 4 shows, in schematic form, how an individual net object is selected out of a bussed net object in a prior art Gate-Level Netlist;

FIG. 36 shows, the netlist of FIG. 35 after carrying out simplification in accordance with the present invention;

FIG. 37 shows a Verilog language model for a tristate driver;

FIG. 38 shows, in schematic form, a netlist produced after elaboration in accordance with the present invention;

FIG. 39 shows, in schematic form, the netlist of FIG. 38 after carrying out the inventive method of "Inferring Complex Components";

DETAILED DESCRIPTION

Figure 1:
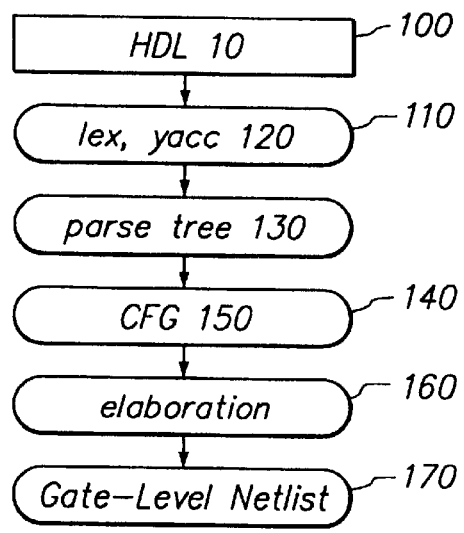
FIG. 1 shows a flow chart of a prior art method of logic synthesis that starts with a designer-specified hardware description language (HDL) model of an electronic logic system and generates a Gate-Level netlist.

Embodiments of the present invention are method and apparatus for performing logic synthesis, i.e., for converting a hardware description language ("HDL") model of an electronic logic system to a netlist (a data structure representation of the logic system that comprises a set of modules, each of which modules comprises a data structure that specifies sub-components and their interconnection). In further embodiments of the present invention, the netlist comprises complex components (such as, for example, latches, flip-flops, multiplexors, and tristates).

As used herein, and as is well known to those of ordinary skill in the art, an HDL model of an electronic logic system is a hardware-independent, designer-specified description of the functionality of the electronic logic system (typically of arbitrary complexity). Many different HDLs have been used in the prior art, for example, Verilog and VHDL are prior art HDLs that are each IEEE standards. Additionally, for purposes of the present invention, the C or C++ programming languages (with extensions), when used to model hardware functionality, are HDLs.

Generic logic or "technology-independent" logic is a specification of logic that does not depend on components defined in a particular vendor's library, but instead depend only on well known generic logic functions. For example, as used herein, a gate is any one of a set of well-known primitive logical operators such as AND, OR, NOT, XOR, XNOR, and so forth. It should also be understood that, as used herein, a gate may also be a larger operator such as, for example, a decoder, a multiplexor, a comparator, and so forth, which larger operator is built of a collection of primitive logical operators. As used herein, a gate is generic logic, i.e., it is technology-independent logic.

The following describes objects used in fabricating embodiments of the present invention. As defined herein, a netlist is a data structure representation of an electronic system that comprises a set of modules, each of which modules comprises a data structure that specifies sub-components and their interconnection. As further defined herein, a module is a data structure that comprises ports, pins, nets, and sub-components. In particular, a port is an object in the module that provides connectivity to objects outside the module boundary; a pin is an object in an instance that connects one port of a module or gate being instantiated to a net in the same module; and a net is an object that connects an arbitrary number of ports and pins together (the ports and pins must be in the same module as the net). Each module port is connected to a net in the same module. As still further defined herein, a sub-component may be a module instance (a module instance is an object that represents a set of connections from nets in one module (the instantiating module) to ports of another module (the instantiated module)) or a gate instance (a gate instance is an object that represents a set of connections from nets in one module (the instantiating module) to the function represented by the gate). Whenever a netlist is comprised of sub-components that are modules, the netlist is referred to as a hierarchical netlist.

Further terminology of hierarchical design is given in more detail here for completeness. In a large design, there may be functions in the design that are used in more than one place. For compactness, these functions may be described in a single module, and then referred to in each usage. Thus, rather than including the detailed description of the function for each use of the function, an object called an "instance" is used to refer to the detailed description. A module containing the detailed description of the function is said to be "instantiated" in the module using the function, which module is said to be the "instantiating" module. The communication of logic signals from the instantiating module to the instantiated module is by means of instantiated module ports, and corresponding instance pins, one instance pin for each instantiated module port. The pin is an object that represents a connection to a net object. One type of pin is a module instance pin, which is used herein to connect a net to a port of an instantiated module. Another type of pin is agate pin, which is used herein to connect a net to a logic function represented by a generic gate, such as AND, OR, or NOT.

Hierarchical design techniques are well understood by those of ordinary skill in the art, and are included in the description of this invention to provide context. There is no special significance to a hierarchical connection of a module instance pin to a net as compared with a gate pin connection to a net. Both are examples of objects connected to nets. This invention concerns innovations in the connection to net itself, not the object that is connected or hierarchical design techniques.

As defined herein, a scalar port/pin/net/gate is a port/pin/net/gate object that represents one logical element in the netlist. A vector (or "bussed") port/pin/net/gate is a port/pin/net/gate object that represents an array of 1 to N logical elements. For example, a 4-bit bussed port object represents 4 ports that are grouped together for convenience of representation. Further, a port/pin/net/gate-bit is one port/pin/net/gate in a bussed port/pin/net/gate.

Lastly, an expression is a basic object in the HDL model that performs an operation on one or more sub-expressions, where the operations are defined by the HDL. As defined herein, vector (or "bussed") expressions are expressions that apply to an array of elements, and a part-select or bit-select is an expression that restricts association to a subset of a bussed object. As used herein, a part-select specifies a high and low range, and a bit-select specifies a single bit position.

Figure 3A:
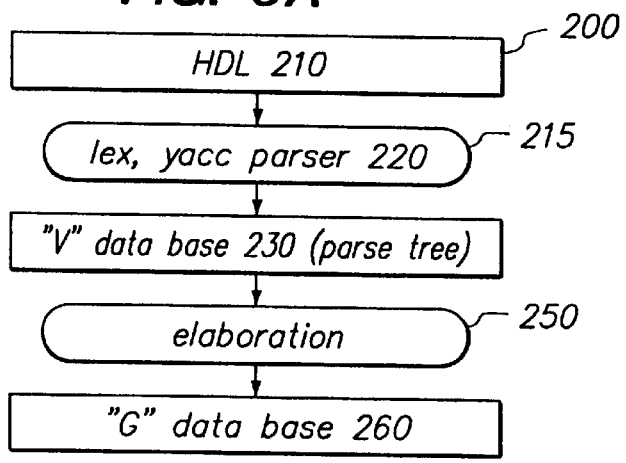
FIG. 3A shows a flow chart of an embodiment of the present invention.

FIG. 3A shows a flow chart of an embodiment of the present invention. As shown in FIG. 3A, in step 200, a designer inputs a model of an electronic logic system having a desired logic functionality in the form of a set of files (HDL 210) that describe the model in a prior art HDL. It should be clear to those of ordinary skill in the art that HDL 210 is created in accordance with any one of a number of methods that are well known to those of ordinary skill in the art.

As further shown in FIG. 3A, in accordance with the present invention, in step 215, lexical analyzer and parser 220 (lex,yacc parser 220) parses HDL 210. lex,yacc parser 220 comprises a lexical analyzer which is written in the lex specification language and a parser which is written in the yacc specification language. Both the lex specification language and the yacc specification languages are well known to those of ordinary skill in the art, however, the present invention is not limited to the use of either of these languages. In fact, embodiments of lex,yacc parser 220 can be written in any one of the many such languages that are well known to those of ordinary skill in the art, for example, the art of compiler design. In accordance with the preferred embodiment of the present invention, lex,yacc parser 220 is written to support the Verilog IEEE HDL standard, but the present invention is not limited to such embodiments. As such, embodiments of the present invention include parsers that also apply to VHDL or any other HDL.

In accordance with the present invention, during parsing step 215, lex,yacc parser 220 populates "V" data base 230 (also referred to below as the parse tree) with objects that have a one-to-one correspondence with HDL objects in HDL model 210. Many methods are well known to those of ordinary skill in the art of, for example, compiler design, for populating "V" data base 230 (the parse tree). At this stage of the inventive method, i.e., after step 215, "V" data base 230 contains incomplete information about each data base object (for example, forward references (i.e., "parent" and "previous" pointers of each statement) which will be described in detail below are not resolved to their target objects because such target objects may not have been parsed yet). In accordance with this embodiment of the present invention, each data base object will have all unresolved references pointers initially designated as NULL.

To illustrate step 215, FIG. 3B shows Verilog HDL that represents the function of a latch and FIG. 3C shows a parse tree that is created during step 215 that corresponds to the Verilog HDL shown in FIG. 3B. As shown in FIG. 3C, arrows represent pointers to related objects. As will be explained in detail below, there are other pointers and/or data in each parse tree object such as, for example, the file name and line number of the associated HDL statement, attributes of an object, and so forth that are not shown for sake of clarity and ease of understanding the present invention.

As still further shown in FIG. 3A, in accordance with the present invention, in step 250, after "V" data base 230 has been generated in step 215, "elaboration" method 250 is carried out to traverse "V" data base 230 and populate "G" data base 260 (a Gate-Level netlist). "G" data base 260 is an independent and complete representation of HDL 210 and references neither components in HDL 210 nor data base objects in "V" data base 230. "G" data base 260 is comprised of generic logic components and provides logic functionality that matches that of HDL 210 exactly for all test patterns applied as input to HDL model 210 in a functional simulation. That is, the internal state and outputs of "G" data base 260 match those of HDL 210 for all possible stimulus patterns.

For sake of clarity and ease of understanding the invention, the following describes some nomenclature before describing elaboration step 250 in detail.

In accordance with one aspect of the present invention, a data structure is used to represent bussed port/pin/net/gate objects and their connections in inventive, compact "G" data base 260. The inventive nature of this data structure, and its use in embodiments of the present invention, is understood as follows. First, most, if not all, prior art HDLs support the use of scalar, vector, and bussed objects; such objects being primarily ports, pins, nets, and expressions. As is well known to those of ordinary skill in the art, bussed objects in an HDL are necessarily, and commonly, used to provide a concise expression of a large amount of functionality. For example, a logic AND operation between each bit of two 32-bit bussed nets is expressed as follows in Verilog:

$$\text{wire } [63:0] \text{ z, a, b;} \tag{1}$$

$$\text{assign } z = a \ \& \ b; \tag{2}$$

It is common practice in the prior art to create a single object in a parse tree for each bussed net and each expression, whether scalar or vector. This is a concise, and complete, representation of the information in HDL 210, and such a data base is called "word-oriented." Note that some prior art logic synthesis systems that rely on a control-flow-graph (CFG) intermediate representation (see the Background of the Invention) use a word-oriented data base for the CFG intermediate representation as well.

Figure 2:
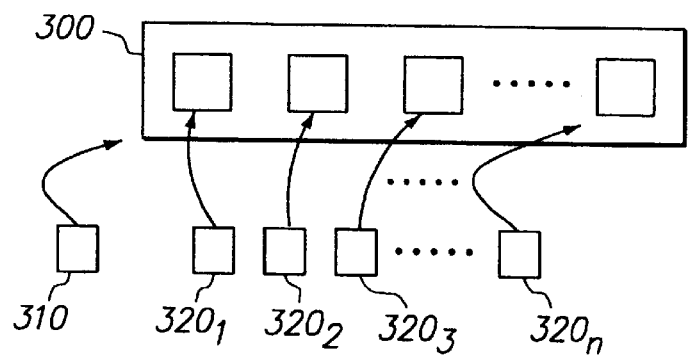
FIG. 2 shows, in schematic form, a bussed net represented in a prior art logic netlist.

However, as described in the Background of the Invention, in prior art logic synthesis systems, an elaboration step produces a Gate-Level Netlist in which each bit of the bussed net and each elaborated gate is represented by a separate data base object. Such a database is called "bit-oriented." Optionally, additional objects in the Gate-Level Netlist track groups of bits to indicate their association as a bus object (as indicated in the HDL model). These objects are optional because the bit-oriented representation of the HDL model, while not concise, is complete. This is illustrated in FIG. 2, and was described above in the Background of the Invention.

Figure 5:
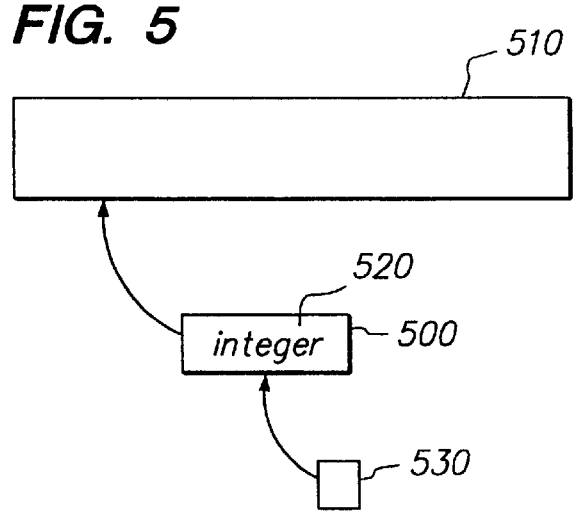
FIG. 5 shows, in schematic form, a bit-select operation in accordance with the present invention (equivalent to that shown in accordance with the prior art in FIG. 4) for use in inventive word-oriented "G" data base.

FIG. 4 shows, in schematic form, how individual net object 420$_3$ is selected out of bussed net object 410 comprised of net objects 420$_1$, ..., 420$_n$ in a prior art Gate-Level Netlist. FIG. 5 shows, in schematic form, a bit-select operation in accordance with the present invention (equivalent to that shown in accordance with the prior art in FIG. 4) for use in inventive word-oriented "G" data base 260. Advantageously, in accordance with the one aspect of the present invention, a single object represents bussed net 510 in a compact fashion in "G" data base 260. It is important to note that, although such a representation of bussed objects is used in the prior art in creating the prior art version of "V" data base 230 (the parse tree), such representation is not used in the prior art to represent the electronic logic system In the prior art version of "G" data base 260. Embodiments of this aspect of the present invention advantageously reduce the amount of computer memory required for logic synthesis.

Thus, in accordance with this aspect of the present invention, novel objects i.e., vector gate objects, are used to represent logic operations on an arbitrarily large number of bits in inventive, word-oriented "G" data base 260. This is contrasted with a prior art Gate-Level Netlist, in which gate instances are represented by an association with one of a family of discrete subsets of logic gates, such as a 2-input AND gate, a 4-input XOR gate, or an 8-bit wide, 2-input OR gate. In fact, prior art logic synthesis systems typically use a large library comprising of a family of logic gates which number sometimes into the hundreds. In contrast to the prior art, in accordance with the present invention, logic gates are customizable by being fully parameterizable, and are not enumerated in libraries. For example, for simple logic gates such as AND, OR, and so forth, the parameters are: (a) number of inputs and bit-width. Advantageously, there is no family of discrete logic gate parameter values and there is no upper limit on the bit-width of the components (other than the maximum integer value represented in the computer system) so the components can be as wide as they have to be.

Conn Objects

In accordance with another aspect of the present invention, novel objects, referred to herein as "conn" objects (neither net nor pin/port objects), are used to fabricate inventive, compact, word-oriented "G" data base 260. In accordance with the present invention, there are several novel types of conn objects: (a) full conn; (b) bit-select conn; (c) part-select conn; (d) concat conn; (e) const conn; and (f) float conn. These conn objects "sit between" pin and net objects to create efficiency in connections represented in "G" data base 260 and will be described next.

Full Conn Object

A full conn object is an object that refers to a complete net object.

Bit-Select Conn Object

To understand the novel bit-select conn object of the present invention, refer to FIGS. 4 and 5. In particular, FIG. 4 shows, in schematic form, how individual net object 420$_3$ is selected out of bussed net object 410 in a prior art Gate-Level Netlist. As shown in FIG. 4, individual net object 420$_3$ is selected out of bused net object 410 by bit-select pin object 400 which has a pointer that contains the address of individual net object 420$_3$. In accordance with the prior art, it is not necessary for bit-select pin object 400 to contain a pointer to bussed net object 410.

FIG. 5 shows, in schematic form, a bit-select operation in accordance with the present invention (equivalent to that shown in accordance with the prior art in FIG. 4) for use in word-oriented "G" data base 260. As shown in FIG. 5, inventive bit-select conn object 500 contains information necessary to represent a bit-select operation of bussed net object 510. In one embodiment of the present invention, the information is a pointer that contains the address of bussed net object 510 and integer value 520, where integer value 520 corresponds to a net bit in a position of bussed net object 510. For this bit-select case, bit-select conn object 500 looks like a bit-select expression that is used in the prior art in a parse tree. However, bit-select conn object 500 is different from such prior art use because, in accordance with the present invention, and as shown in FIG. 5: (a) bussed net object 510 is a target of bit-select conn object 500 in "G" data base 260 and (b) pin object 530 is a source of bit-select conn object 500 in "G" data base 260. This is different from the prior art because, if used in accordance with the prior art, the target of bit-select conn object 500 (instead of being bussed net object 510 in accordance with the present invention) would be an identifier in HDL 110, and the source of bit-select conn object 500 (instead of being pin object 530 in accordance with the present invention) would be an expression.

Thus, in accordance with the present invention, in "G" data base 260, advantageously, a discrete object is not required to model each bit of a bussed net. Note, however, that an additional object is required to handle each case in which a bit is selected out of the bussed net.

Part-Select Conn Object

Figure 6:
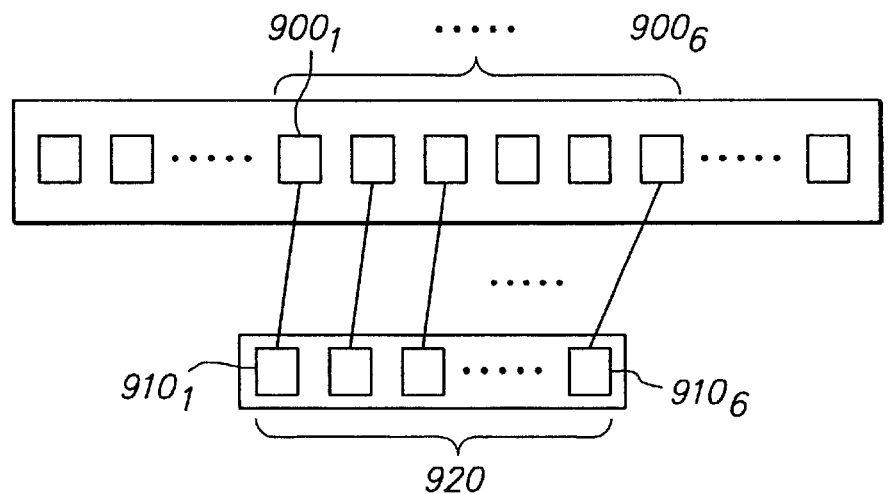
FIG. 6 shows, in schematic form, how a multiplicity of net objects are each connected to pin objects in a set in a prior art Gate-Level Netlist.
Figure 7:
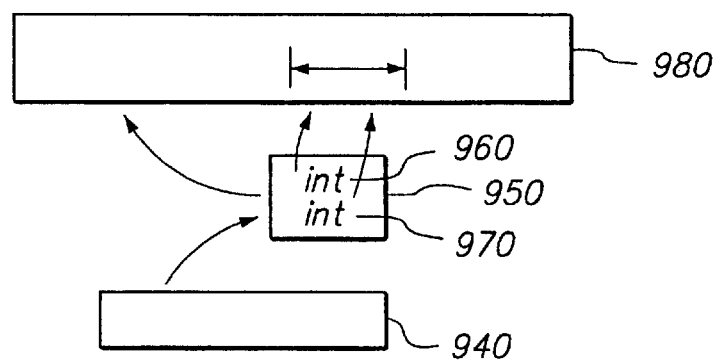
FIG. 7 shows, in schematic form, a representation in accordance with the present invention (equivalent to that shown in accordance with the prior art in FIG. 6), where a part-select conn object is used to represent a range of individual connections in inventive word-oriented "G" data base.

To understand the novel part-select conn object of the present invention, refer to FIGS. 6 and 7. In particular, FIG. 6 shows, in schematic form, how a multiplicity of net objects 900$_1$–900$_6$ are each connected to pin objects 910$_1$–910$_6$ in set 920 in a prior art Gate-Level Netlist. As one can readily appreciate from this, a large number of objects are required to represent the circuit.

FIG. 7 shows, in schematic form, a representation in accordance with the present invention (equivalent to that shown in accordance with the prior art in FIG. 6), where part-select conn object 950 is used to represent a range of individual connections in word-oriented "G" data base 260. As shown in FIG. 7, pin object 940 connects to part-select conn object 950. In accordance with the present invention, part-select conn object 950 comprises a pointer to net object 980 and integers 960 and 970, which integers 960 and 970 specify a range of values in net object 980. Advantageously, this maintains the word-oriented representation of "V" data base 230 (the parse tree) for this circuit in "G" data base 260. Note that concise representations such as a part-select conn object do not need to be present in the same form in HDL 210 since, alternative embodiments of the inventive logic synthesis system can construct such word-oriented concise representations by analyzing bit-oriented constructs in HDL 210 using any one of a number of methods that are well known to those of ordinary skill in the art, and replacing the bit-oriented constructs with equivalent word-oriented constructs, where possible.

Concat Conn Object

Figure 8:
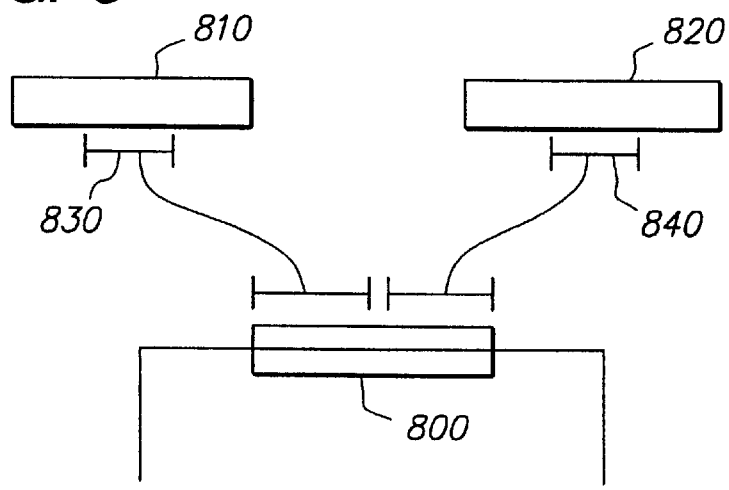
FIG. 8 shows, in schematic form, a circuit in which a bussed pin connects to two different sub-ranges of two nets.
Figure 9:
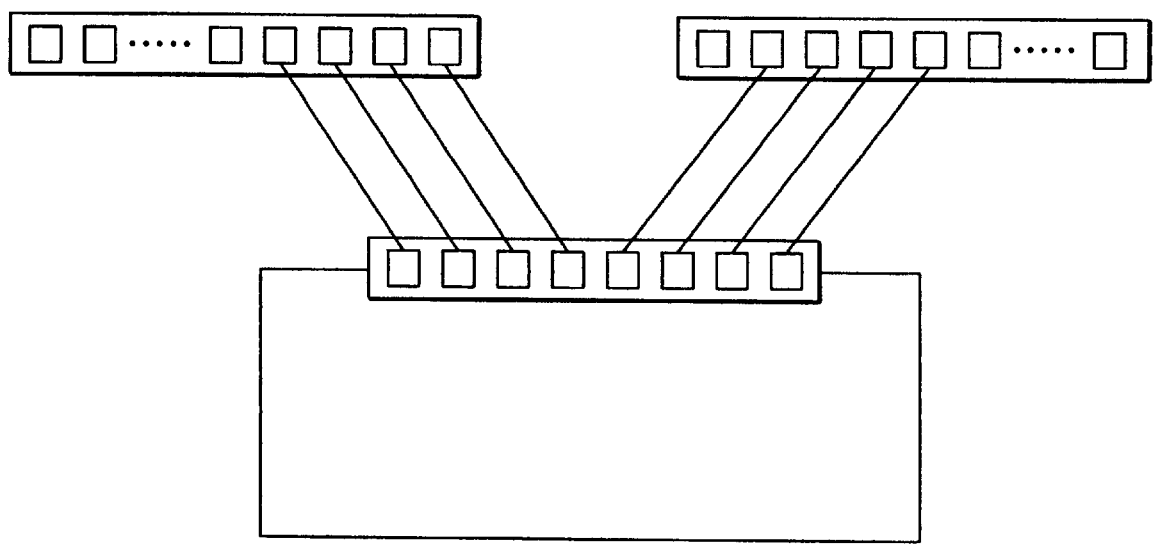
FIG. 9 shows a prior art, bit-oriented Gate-Level Netlist representation of the circuit shown in FIG. 8.
Figure 10:
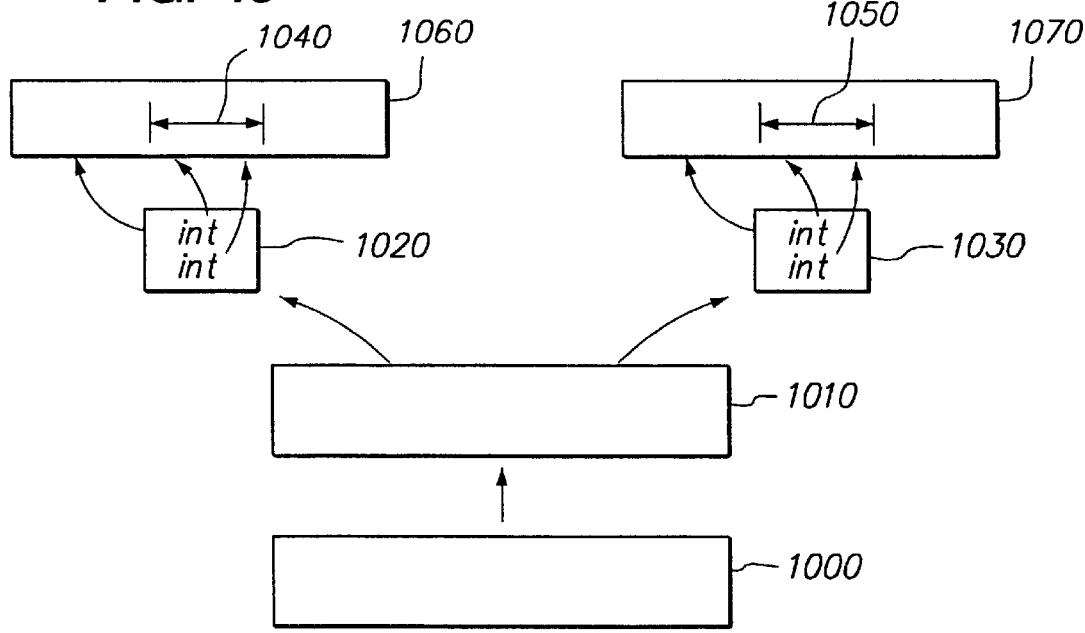
FIG. 10 shows a representation in accordance with the present invention (equivalent to that shown in accordance with the prior art in FIG. 9) where a concat conn object is used in an inventive word-oriented "G" data base representation of the circuit shown in FIG. 8.

To understand the novel concat conn object of the present invention, refer to FIGS. 8–10. In particular, FIG. 8 shows, in schematic form, a circuit in which bussed pin 800 connects to two different sub-ranges 830 and 840 of nets 810 and 820, respectively. FIG. 9 shows a prior art, bit-oriented, Gate-Level Netlist representation of the circuit shown in FIG. 8. In accordance with the prior art, the bussed nets and bussed pins are broken down into individual bits and, as a result, connections are made for each bit separately. As one can readily appreciate from this, a large number of objects is required to represent the circuit.

FIG. 10 shows a representation in accordance with the present invention (equivalent to that shown in accordance with the prior art in FIG. 9) where concat conn object 1010 is used in a word-oriented "G" data base 260 representation of the circuit shown in FIG. 8. As shown in FIG. 10, bussed pin object 1000 connects to concat conn object 1010. In accordance with the present invention, concat conn object 1010 comprises pointers to an-arbitrary number of conn objects, in this case, part-select conn objects 1020 and 1030. Further, in accordance with the description above, each of part-select conn objects 1020 and 1030 contain information to specify subsets 1040 and 1050 of their target net objects 1060 and 1070, respectively.

Const Conn Object

Figure 11:
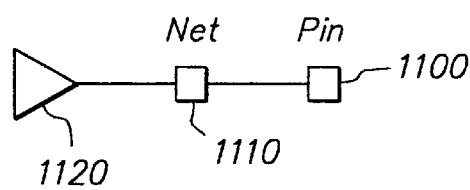
FIG. 11 shows, in schematic form, a prior art Gate-Level Netlist representation in which a pin is driven by a constant value logic 0.

As is well known to those of ordinary skill in the art, in addition to connecting nets and pins together, a logic netlist data base must provide a representation of logic0 and logic1 values that are associated, for example, with ground and power, respectively. These are constant logic values (not necessarily binary) that do not depend on any input value. To understand the novel representation of logic0 and logic 1 in accordance with the present invention, refer to FIGS. 11 and 12. In particular, FIG. 11 shows, in schematic form, a prior art Gate-Level Netlist representation in which pin 1100 is driven by a constant value logic0. In accordance with the prior art Gate-Level Netlist representation, logic0 and logic1 are represented by a special type of logic gate that has no input and one output whose value is always 0 or 1. As shown in FIG. 11, for logic0, logic0 gate object 1120 is connected to net object 1110, and net object 1110 is connected, in turn, to pin object 1100.

Figure 12:
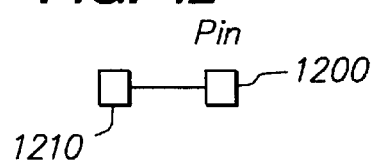
FIG. 12 shows a representation of a pin being driven by a constant value logic0 in accordance with the present invention (equivalent to that shown in accordance with the prior art in FIG. 11)

FIG. 12 shows a representation of a pin being driven by logic0 in accordance with the present invention (equivalent to that shown in accordance with the prior art in FIG. 11). In accordance with the present invention, because: (a) pin object 1200 is expected to connect to a conn object (and not directly to a net object as occurs in the prior art Gate-Level Netlist) and (b) a mechanism exists for different types of conn objects (full, part-select, bit-select, concat), logic0 and logic1 are modeled by a conn object called const-conn (instead of a special gate type as is the case for the prior art Gate-Level Netlist). As shown in FIG. 12, const-conn object 1210 is connected directly to pin object 1200. Advantageously, in accordance with the present invention, intermediate net or logic gate objects are not required for this representation and, as a result, it is more compact than the prior art. As one of ordinary skill in the art can readily appreciate from the above, the inventive method of representing constant logic values using conn objects can be used for logic synthesis to create bit-oriented netlists as well as word-oriented netlists.

Float Conn Object

Figure 13:
FIG. 13 shows, in schematic form, a floating output connection in a prior art Gate-Level Netlist representation.
Figure 14:
FIG. 14 shows a representation of a floating output connection in accordance with the present invention (equivalent to that shown in accordance with the prior art in FIG. 13)

In addition to a representation for constant input (for example, logic0 and, logic 1 described above), a logic netlist data base must provide a representation of an undriven or floating output. To understand the novel representation of a floating output in accordance with the present invention, refer to FIGS. 13 and 14. In particular, FIG. 13 shows, in schematic form, a floating output connection in a prior art Gate-Level Netlist representation. As shown in FIG. 13, pin object 1300 connects to net object 1310, and net object 1310 has no other connections. FIG. 14 shows a representation of a floating output connection in accordance with the present invention (equivalent to that shown in accordance with the prior art in FIG. 13). In accordance with the present invention, in "G" data base 260, pin object 1400 connects instead to float-conn object 1410, which float-conn object 1410 represents a floating output connection. No intermediate net object is required in the inventive representation in "G" data base 260. As one of ordinary skill in the art can readily appreciate from the above, the inventive method of representing undriven or floating output using conn objects can be used for logic synthesis to create bit-oriented netlists as well as word-oriented netlists.

In accordance with the present invention, advantages in efficiency, in addition to those described above, are obtained in the representation of "G" data base 260 by: (a) enabling a single const conn object or a single float conn object to represent an arbitrary bit-width const or float connection and (b) including a const conn object and a float conn object in a concat conn object (enables partially constant or partially floating connections to be represented efficiently).

Elaboration Method

Still another aspect of the present invention is an inventive vector elaboration method by which "V" data base 230 (the parse tree created from parsing HDL 210) is traversed to populate "G" data base 260. In accordance with the present invention, the elaboration method comprises the steps of: (a) preprocessing; (b) recursively traversing top-level statements in parse tree process objects; and (c) connecting net objects in word-oriented "G" data base 260.

As is well known to those of ordinary skill in the art, an HDL model can be divided into two logical categories, structural HDL and procedural HDL, which categories can be mixed within a single model. In structural HDL, HDL expressions are written to describe the logic with a one-to-one correspondence or a one-to-many correspondence to the intended logic gates in the Gate-Level Netlist. A typical prior art HDL offers compact representations such as vector expressions and arithmetic logic expressions. As a result, mapping from structural HDL to a Gate-Level Netlist is generally straightforward and there are many methods which are well known to those of ordinary skill in the art for accomplishing this task. Consider the following structural HDL (written in Verilog):

$$\text{wire [3:0] a, b, c;} \tag{3}$$

$$\text{assign c=a c;} \tag{4}$$

As seen from the above, a continuous assignment maps directly to 4 OR logic gates (or a 4-bit vector OR gate) in the Gate-Level Netlist. Because objects in inventive word-oriented "G" data base 260 are similar to parse-tree objects, creating "G" data base 260 for such structural HDL is straightforward, and should be well understood by those of ordinary skill in the art.

In procedural HDL, a serial chain of assignment and conditional statements are used to specify logic behavior, much like a conventional programming language such as the "C" language. The difference between structural and procedural HDL, as well as the intended logic function specified by various styles of procedural HDL, is well understood by those of ordinary skill in the art.

As is well known to those of ordinary skill in the art, there are three basic types of procedural HDL statements: (a) assignment; (b) conditional; and (c) block. In fact, there are many other types of procedural HDL statements such as, a case statement (like the C language version); task and function calls; disable; and looping statements. However, as is well known to those of ordinary skill in the art, all of the other types of procedural HDL statements can be resolved into the three basic types described in detail below. In an assignment statement, an HDL identifier appearing on the left-hand-side of the HDL assignment statement is used to store the value of the right-hand side of the HDL assignment statement, the value being determined at that point in the procedural statement chain. In a conditional statement, an expression involving HDL identifiers is evaluated, and processing continues into one or more statements. It should be well understood by those of ordinary skill in the art that the terms assignment statement and references to HDL identifiers always refer to the current value of the identifier, i.e., as processing of a serial statement chain continues top-to-bottom. Lastly, a block statement is used to hold one or more additional statements. As is well known to those of ordinary skill in the art, a block statement performs no assignment or conditional operation by itself, but may contain such statements, or additional block statements, for an arbitrarily nested procedural HDL statement.

In accordance with a preferred embodiment of the inventive elaboration method, arbitrary left and right ranges of vector identifiers specified by a designer in HDL 210 are represented by a zero-based offset wherein bit position 0 always refers to a right index and bit position (width−1) always refers to a left index. In accordance with this, a bit position of an HDL identifier or of a net object in "G" data base 260 is bound by a range (width−1) and 0, inclusive. Advantageously, this notation simplifies handling of arbitrary designer-defined left and right vector ranges.

For sake of clarity and ease of understanding the invention, the following describes some further nomenclature.

Chunk

Figure 15:
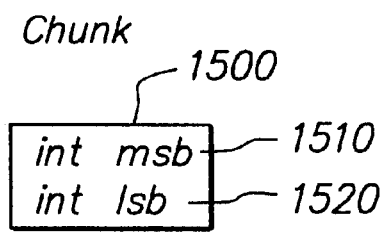
FIG. 15 shows, in schematic form, novel chunk data that is used in accordance with the present invention.

FIG. 15 shows, in schematic form, novel chunk 1500 that is used in accordance with the present invention. Chunk 1500 comprises two (2) integers, a most-significant-bit (msb) 1510 and a least-significant-bit (lsb) 1520, each of which represents a bit position in: (a) a data object in "V" data base 230 that represents an HDL identifier selected for assignment or (b) a bussed net object in "G" data base 260, depending on how the chunk is used. As described above, (width−1) >=msb >=lsb >=0.

Update Object

Figure 16:
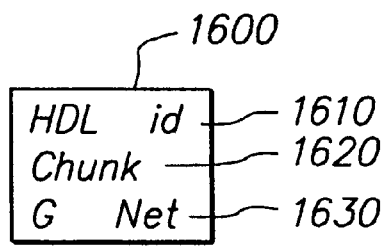
FIG. 16 shows, in schematic form, a novel update object that is used in accordance with the present invention.

FIG. 16 shows, in schematic form, novel update object 1600 that is used in accordance with the present invention. As shown in FIG. 16, update object 1600 comprises three (3) items: (a) pointer 1610 which points to the address of a data object in "V" data base 230 (the parse tree) that represents an HDL identifier selected for assignment; (b) chunk 1620; and (c) pointer 1630 which points to the address of an object in "G" data base 260 that represents a bussed net object.

Chunk 1620 refers to a contiguous portion of the data object in "V" data base 230 that represents the HDL identifier selected for assignment. In accordance with a preferred embodiment of the present invention, an update object is associated with each assignment statement object.

Parent and Previous Pointers

In accordance with a preferred embodiment of the present invention, each statement object in "V" data base 230 (the parse tree) has two pointers to other statement objects, one called a "parent" pointer and the other called a "previous" pointer. A statement object's parent pointer points to a statement object that immediately encloses the statement object in the parse tree. For the first statement object in a procedural HDL block (the "top-level" statement object), the statement object's parent pointer points to a root statement object which is unique to that procedural HDL block (the root statement object has no meaning other than to indicate an end of traversal of the parse tree). For all statement objects other than the first statement object (the "top-level" statement object), the parent pointer points to a statement object in the procedural HDL block that encloses it. A statement object's previous pointer points to the nearest completed statement object, traversing in a direction backwards towards the root of the parse tree. If a procedural HDL block statement object encloses the current statement object, the procedural HDL block statement object is not considered to have been completed. For the first statement object (the "top-level" statement object) in a procedural HDL block, the statement object's previous pointer points to the root statement object unique to that procedure HDL block. In accordance with the present invention, the "parent" and "previous" pointer of each statement object are both initialized to NULL on creation of "V" data base 230 (the parse tree).

Figures 18, 18A:
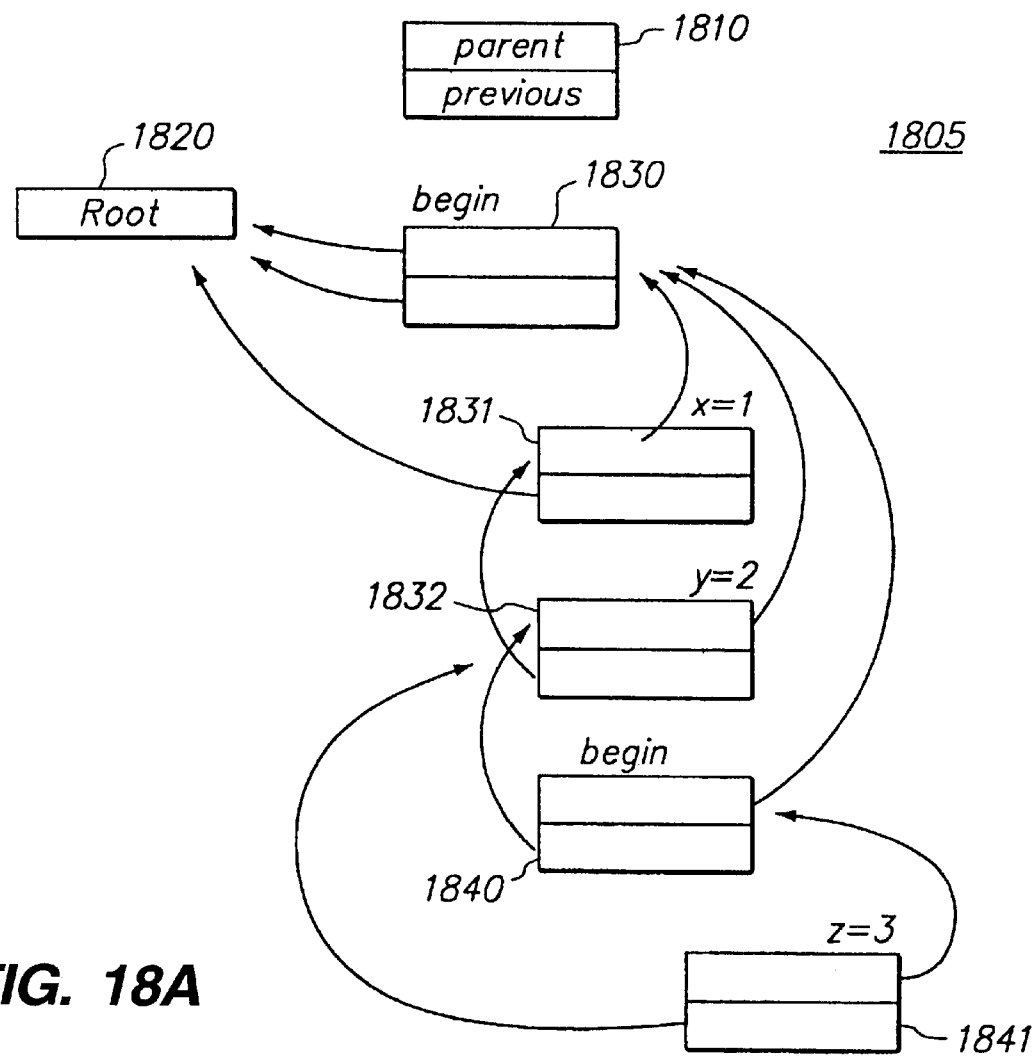
FIG. 18 shows a procedural HDL block that is written in Verilog.
FIG. 18A shows a parse tree for the procedural HDL block in the "V" data base, showing only parent and previous pointers.

FIG. 18 shows procedural HDL block 1800 that is written in Verilog and FIG. 18A shows a parse tree 1805 for procedural HDL block 1800 in "V" data base 230, showing only the parent and previous pointers for clarity and ease of understanding the concept of parent and previous pointers for clarity and ease of understanding the concept of parent and previous pointers. As shown in FIG. 18A, pointer group 1810 shows the configuration of the parent and previous pointers illustrated in FIG. 18A. As further shown in FIG. 18A, pointer groups 1830 and 1840 represent procedural HDL block statement objects, and pointer groups 1831, 1832, and 1941 represent procedural HDL assignment statement objects. As still further shown in FIG. 18A, parent pointers of assignment statement objects 1831 and 1832 and block statement object 1840 all point to block statement object 1830, and the parent pointer of assignment statement object 1841 points to block statement object 1840. The previous pointers of block statement object 1830 and assignment statement object 1831 point to root statement object 1820 because there is no completed statement object prior to assignment statement object 1831. The previous pointer of assignment statement object 1832 points to assignment statement object 1831, and the previous pointer of block statement object 1840 points to assignment statement object 1832. Lastly, the previous statement of assignment statement object 1841 points to assignment statement object 1832, not to block statement object 1840, because block statement object 1840 has not been completed as looking upwards from statement object 1841 contained inside block statement object 1840.

Figure 19:
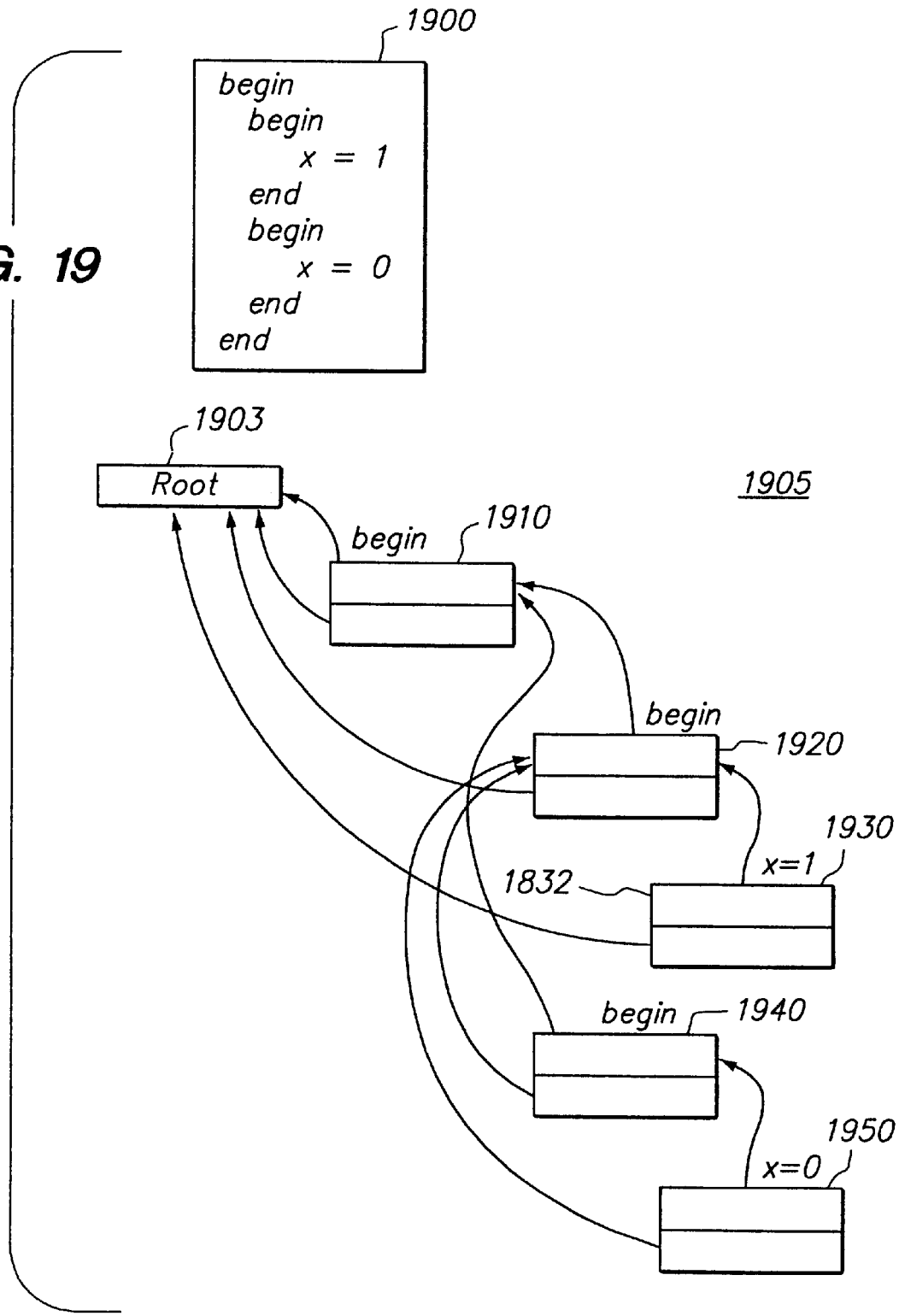
FIG. 19 shows another procedural HDL block that is written in Verilog and a parse tree for the procedural HDL block in the "V" data base, showing only parent and previous pointers.

FIG. 19 shows another procedural HDL block 1900 that is written in Verilog and parse tree 1905 for procedural HDL block 1900 in "V" data base 230 showing only the parent and previous pointers for clarity and ease of understanding the concept of parent and previous pointers. As shown in FIG. 19, pointer groups 1910, 1920 and 1940 are block statement objects, and pointer groups 1930 and 1950 are assignment statement objects. Assessment of the parent pointers is straightforward in that an enclosing block statement object is pointed to, or root 1903 is pointed to, for block statement object 1910 (the top-level block statement object). The previous pointers for block statement objects 1910 and 1920 and for assignment statement object 1930 point to root 1903 because there are no completed statement objects before assignment statement object 1930. Note that block statement objects 1910 and 1920 are not complete until all statement objects within them are complete. To determine the previous pointer for block statement object 1940, one traverses parse tree 1905 towards root 1903. This traversal first finds first block statement object 1920. Since block statement object 1920 is complete, block statement object 1920 is the previous pointer for block statement object 1940. Note that assignment statement object 1930 is not selected as the previous pointer for block statement object 1940 because it is not on an "upwards path" towards root 1903 from block statement object 1940. Similarly for assignment statement object 1950, traversal towards root 1903 gives block statement object 1940, which is not yet complete, and then block statement object 1920, which is complete. As a result, block statement object 1920 is selected as the previous pointer for assignment statement object 1950.

Cache Item and Cache

Figure 20:
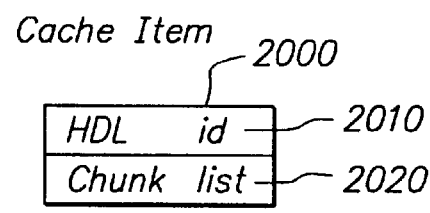
FIG. 20 shows, in schematic form, a novel database object referred to as a cache item.

FIG. 20 shows, in schematic form, novel database object 2000 referred to as a cache item. In accordance with the present invention, every statement object comprises a set of cache items (the set is referred to herein as a cache), one cache item for each HDL identifier that is "assigned to" in any statement object "enclosed" by the statement object. As defined herein, statement object s1 is "enclosed" by statement object s2 if a recursive traversal of the parent pointer of statement object s1 at any time points to statement object s2. For example, a block statement object encloses all statement objects that are immediately part of it (also called the block statement's immediate sub-statements), and also all statement objects that are immediate sub-statements of any sub-statement of that block, recursively. In accordance with the present invention, as shown in FIG. 20, cache item 2000 comprises: (a) pointer 2010 which points to the address of a data object in "V" data base 230 (the parse tree) that represents an HDL identifier and (b) chunk list 2020 of chunks that refer to the HDL identifier.

Thus, as applied to cache item 2000 of FIG. 20, chunk list 2020 records, for HDL identifier 2010, the range of chunks that are "assigned to" by any statement objects "enclosed" by the statement object. In accordance with the present invention, even if sub-ranges of HDL identifier 2010 are "assigned to" in different statement objects, any statement objects that enclose all such assignment statement objects will represent the range "assigned to" as a single chunk.

Figure 24:
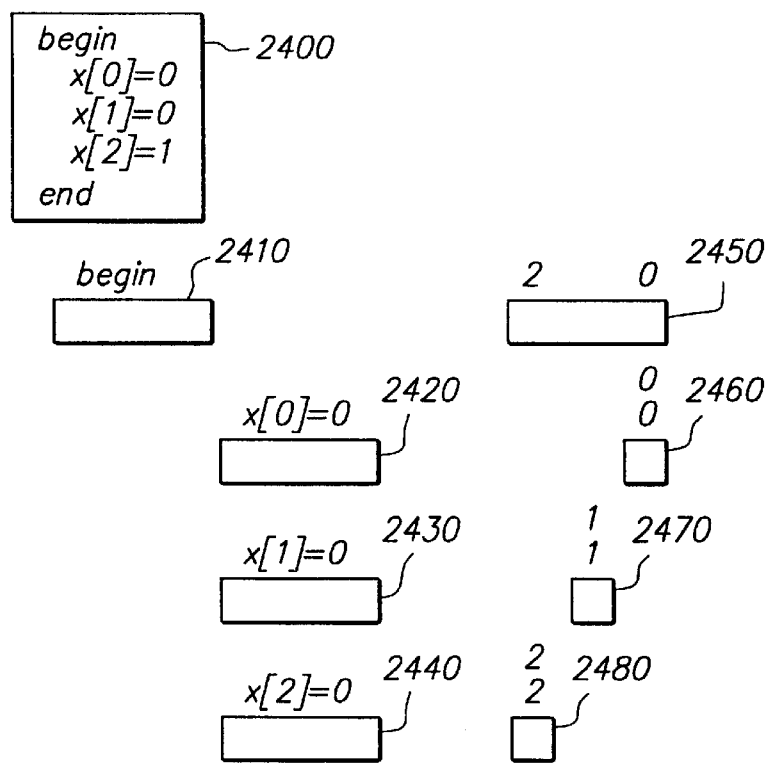
FIG. 24 shows, in schematic form, how a chunk list records a range of chunks that are "assigned to" by any statements "enclosed" by the statement.

FIG. 24 shows, in schematic form, how a chunk list records the range of chunks that are "assigned to" by any statement objects "enclosed" by the statement object. As shown in FIG. 24, in procedural HDL fragment 2400, a block statement encloses three (3) assignment statements, each of which assignment statements assigns a different bit of HDL identifier 'x'. As further shown in FIG. 24, statement object 2410 (corresponding to the block statement, i.e., begin), statement object 2420 (corresponding to the first assignment statement, i.e., x[0]=0), statement object 2430 (corresponding to the second assignment statement, i.e., x[1]=0), and statement object 2420 (corresponding the third assignment statement, i.e., x[2]=1), represent the statement objects in "V" data base 230 (the parse tree).

For ease of understanding the concept of chunk lists, statement objects 2410–2440 do not include any other information contained therewithin. Chunk list 2450, chunk list 2460, chunk list 2470, and chunk list 2480 are chunk lists in a cache item for each statement object, respectively. In this example, each statement object has only one cache item, i.e., one cache item that points to HDL identifier 'x'. However, each chunk list shows the ranges of 'x' assigned in each statement differently. For example, chunk list 2460 shows a chunk with msb=0 and lsb=0 since this represents the bit-select operation x[0] in the corresponding part of HDL fragment 2400; similarly for chunk lists 2470 and 2480. Note that chunk list 2450 shows the effect of a merge operation (to be described in detail below) on all chunk lists for 'x' cache items, which gives a single chunk having msb=2 and lsb=0.

Figure 25:
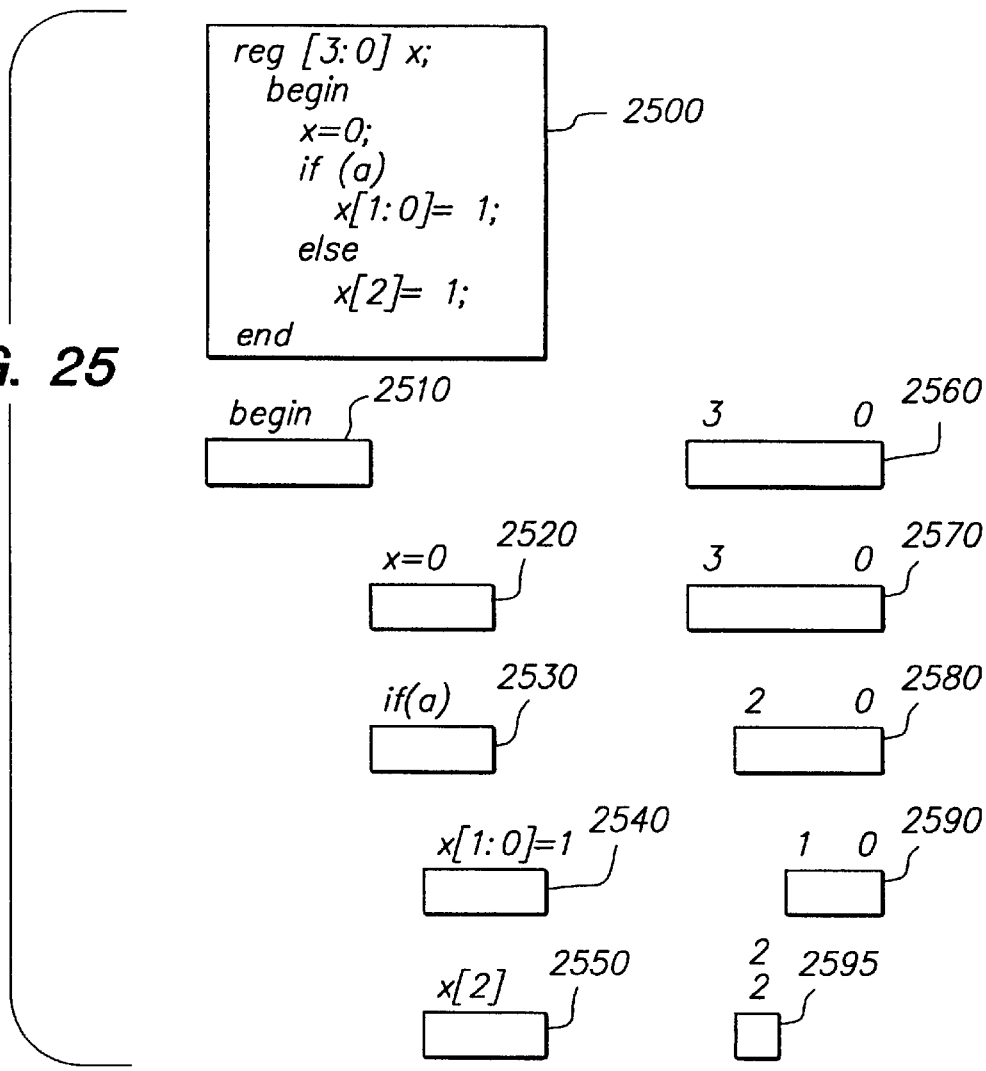
FIG. 25 shows, in schematic form, how a chunk list records a range of chunks that are "assigned to" by any statements "enclosed" by the statement in a more complex example than that shown in FIG. 24, i.e., in procedural HDL which includes a conditional statement.

FIG. 25 shows, in schematic form, how a chunk list records the range of chunks that are "assigned to" by any statement objects "enclosed" by the statement object in a more complex example than that shown in FIG. 24, i.e., in procedural HDL fragment 2500 which includes a conditional statement. As shown in FIG. 25, each statement in HDL fragment 2500 has a corresponding statement object 2510–2550 (note that the 'else' is not a separate statement but is part of the 'if' statement). For ease of understanding the concept of chunk lists, chunk lists in cache items for each statement object (again all referring to identifier 'x') are shown as in FIG. 24. Chunk lists 2570, 2590 and 2595 are chunk lists for simple assignment statement objects 2520, 2540 and 2550, respectively, showing the exact range of the left-hand-side of the HDL assignment statement objects. Chunk list 2580 corresponds to the 'if' statement in fragment 2500 (statement object 2530), and all statements enclosed by the 'if' statement include assignment statements for bits 2 through 0, inclusive. Thus, chunk list 2580 is obtained from the merge operation (to be described in detail below) on chunks 2595 and 2590. Chunk list 2560 for block statement object 2510 encloses all statement objects, so it shows the full range of 'x' assignments.

Figure 21:
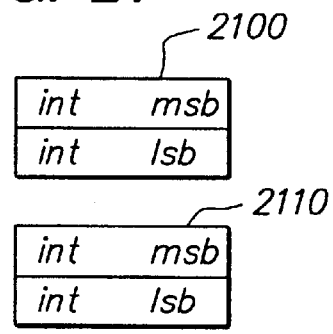
FIG. 21 shows, in schematic form, two chunks.

FIG. 21 shows, in schematic form, chunks 2100 and 2110. As defined herein, chunks 2100 and 2110 overlap if any of the integer values between and including the msb and the lsb of chunk 2100 are the same as integer values between and including the msb and the lsb of chunk 2110. In accordance with the present invention, a merge operation produces either one or two chunks that represent the range covered by chunks 2100 and 2110. If chunks 2100 and 2110 overlap, then the merge operation produces a single chunk which covers the superset of the range of chunks 2100 and 2110. If chunks 2100 and 2110 do not overlap, then the merge operation produces two chunks 2100 and 2110.

Figure 22:
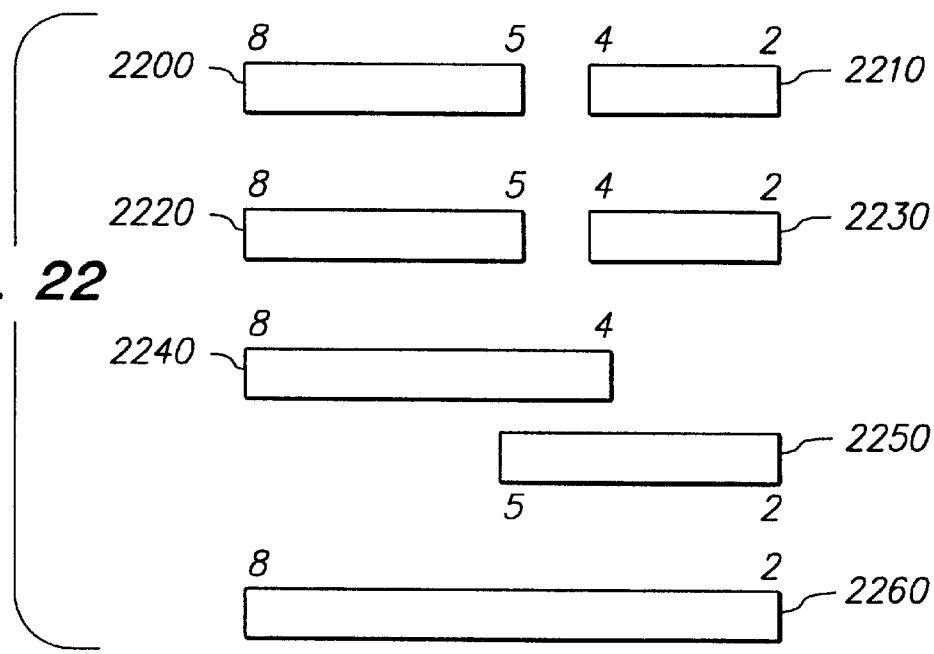
FIG. 22 shows, in schematic form, two examples of a merge operation in accordance with the present invention.
Figure 23:
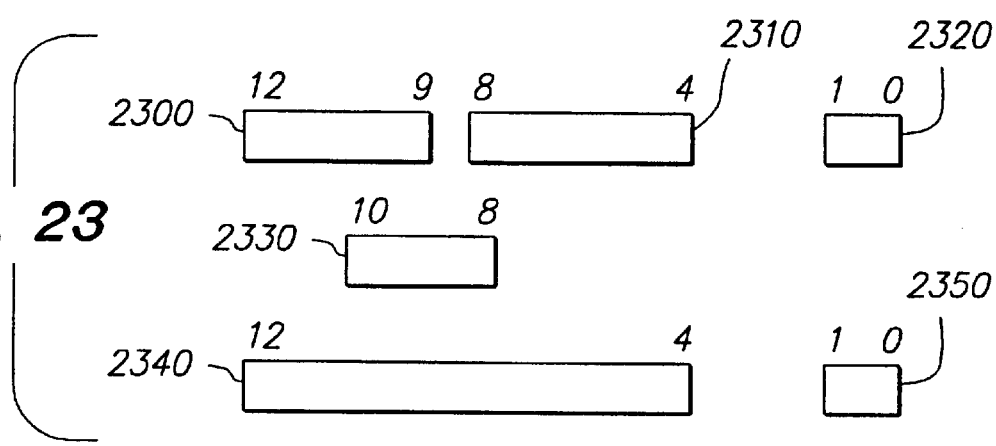
FIG. 23 shows, in schematic form, a merge operation of a chunk with a list of chunks.

FIG. 22 shows, in schematic form, two examples of a merge operation in accordance with the present invention. As shown in FIG. 22, chunks 2200 and 2210 have (msb, lsb) equal to (8, 5) and (4, 2), respectively. The result of the merge operation on chunks 2200 and 2210 results in chunks 2220 and 2230 which are the same as chunks 2200 and 2210 because chunks 2200 and 2210 do not overlap. As further shown in FIG. 22, chunks 2240 and 2250 are merged to give chunk 2260 which spans the full range of chunks 2240 and 2250 because chunks 2240 and 2250 overlap. Thus, in accordance with the present invention, a list of chunks is in a minimal representation if all pairs of two chunks do not overlap. Further, in accordance with the present invention, the merge operation takes a list of chunks in a minimal representation and a single chunk, and returns a new list of chunks in a minimal representation that is equivalent to the single chunk having been merged recursively with each chunk in the list. FIG. 23 shows, in schematic form, a merge operation of chunk 2330 with a chunk list of chunks 2300, 2310, and 2320. The result of the merge operation is the minimal representation chunk list of chunks 2340 and 2350. In light of the above, it should be clear to those of ordinary skill in the art that the result of the merge operation is an optimal representation of ranges covered by all individual chunks input to the merge operation.

Figure 18B:
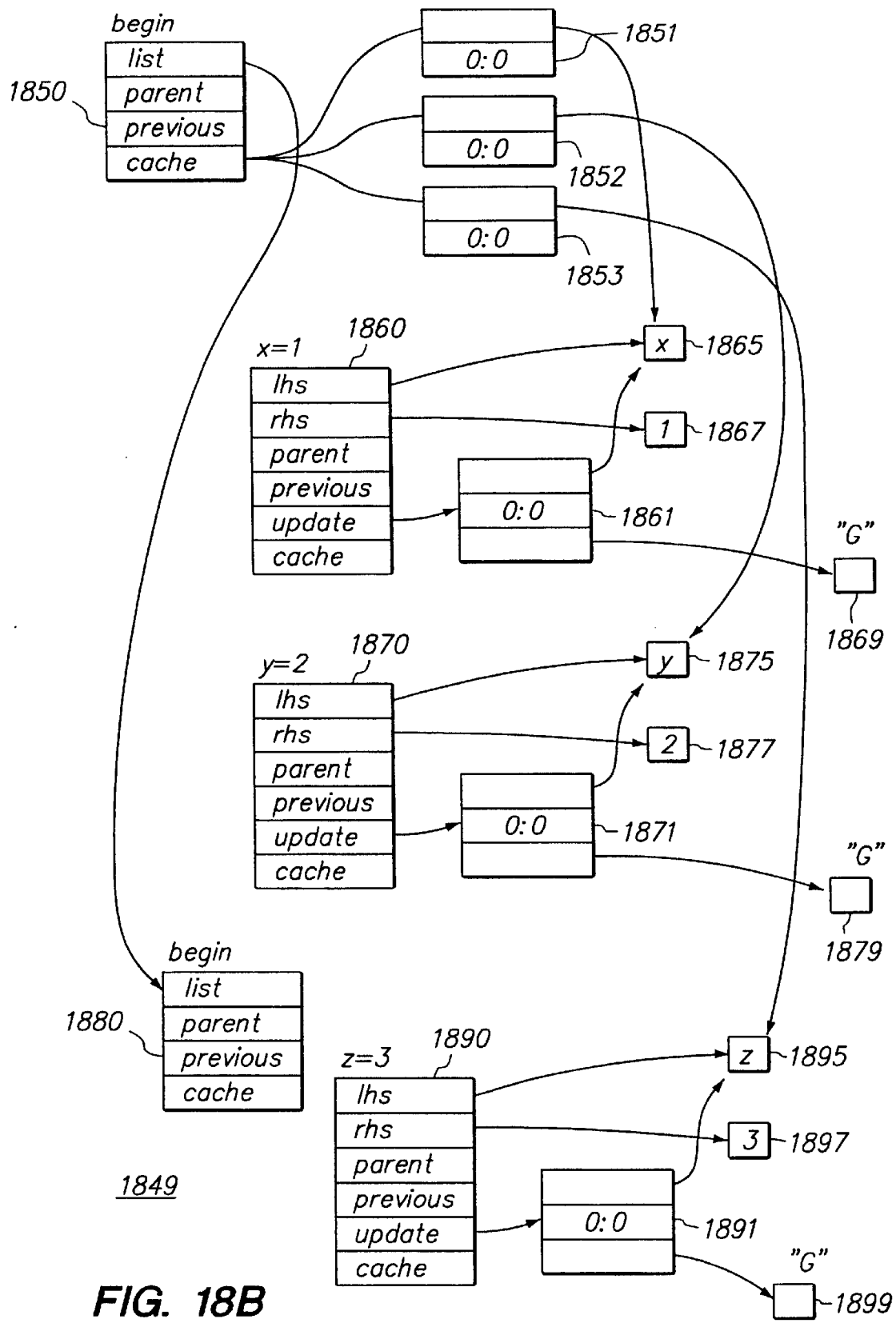
FIG. 18B shows, in schematic form, a representation of a parse tree of the procedural HDL block shown in FIG. 18A.

Lastly, FIG. 18B shows, in schematic form, a representation of the parse tree of procedural HDL block shown in FIG. 18A. For ease of understanding the inventive elaboration method, not all of the information contained therewithin is shown. As shown in FIG. 18B, parse tree 1849 comprises block statement objects 1850 and 1880 and assignment statement objects 1860, 1870, and 1890. As further shown in FIG. 18B, block statement objects 1850 and 1880 comprise: (a) a list pointer which provides a linked list to all immediate sub-statement objects in parse tree 1849; (b) parent and previous pointers (discussed above); and (c) a cache which points to a set of cache items, one set of cache items corresponding to each HDL identifier "assigned to" by statement objects enclosed by the block statement object. As still further shown in FIG. 18B, cache items 1851, 1852, and 1853 point to object 1865, i.e., 'x', object 1875, i.e., 'y', and object 1895, i.e., 'z', respectively. Also note that cache items 1851, 1852, and 1853 each comprise a chunk list for the corresponding HDL identifier. As still further shown in FIG. 18B, assignment statement objects 1860, 1870, and 1890 comprise: (a) pointers to HDL identifiers on the left hand side of an assignment statement (objects 1865, 1875, and 1895, respectively) and the right hand side of the assignment statement (objects 1867, 1877, and 1897, respectively); (b) parent and previous pointers (discussed above); (c) a pointer to an update object (objects 1861, 1871, and 1881, respectively); and (d) a cache which points to a set of cache items, one corresponding to each HDL identifier "assigned to" by the assignment statement. As yet still further shown in FIG. 18B, update objects 1861, 1871, and 1891: (a) point to object 1865, i.e., 'x', object 1875, i.e., 'y', and object 1895, i.e., 'z', respectively in "V" data base 230; (b) point to object 1869, i.e., 'x', object 1879, i.e., 'y', and object 1899, i.e., 'z', respectively in "G" data base 260; and (c) contain a chunk for object 1865, i.e., 'x', object 1875, i.e., 'y', and object 1895, i.e., 'z', respectively.

Figure 41:
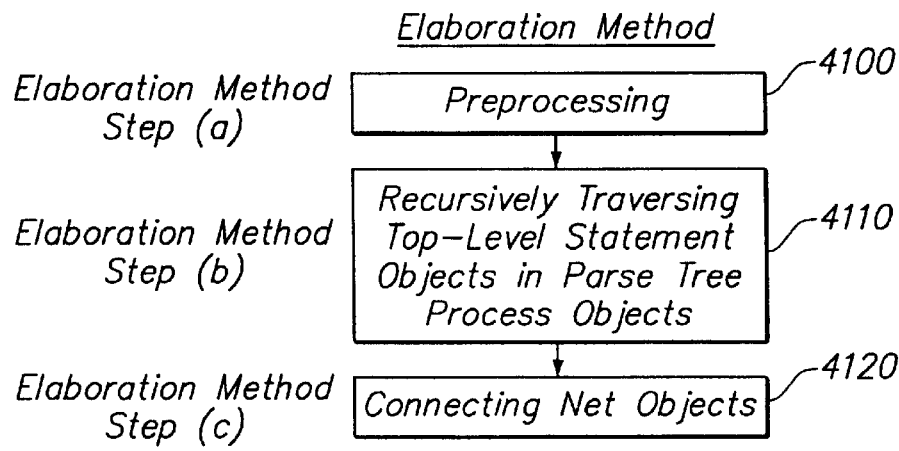
FIG. 41 shows a flowchart of the inventive elaboration method.

We now turn to a detailed description of the invention elaboration method. FIG. 41 shows a flowchart of the inventive elaboration method. As shown in FIG. 41, an embodiment of the inventive elaboration method comprises the steps of: (a) preprocessing; (b) recursively traversing top-level statements in parse tree process objects; and (c) connecting net objects in word-oriented "G" data base 260.

Elaboration Method Step(a): Preprocessing

For each HDL identifier in "V" data base 230 (the parse tree), a net object is created in "G" data base 260 having the same name and width as the HDL identifier. For the time being, these net objects are left unconnected, except for net objects corresponding to HDL identifiers that represent module ports. For each HDL identifier that represents a module port, a full-conn object is created in "G" data base 260 to connect the net object to the port object in accordance with the HDL model.

Figure 42:
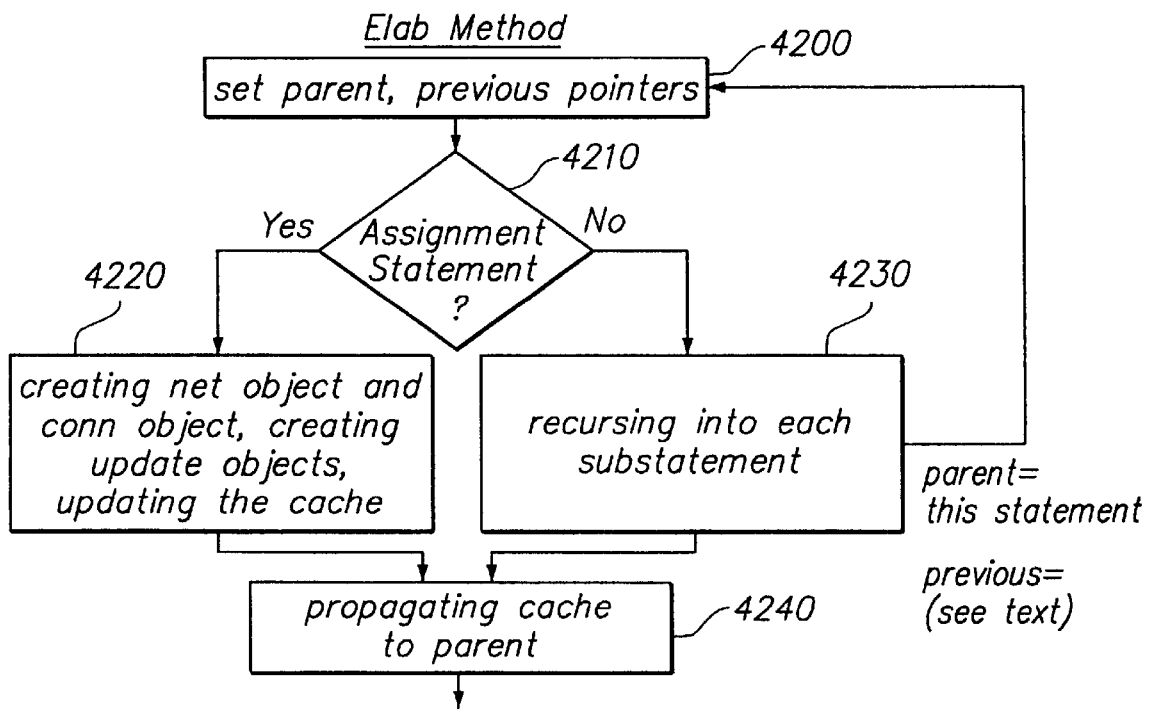
FIG. 42 shows a flowchart of an inventive "elab" method that is carried out as step(b) of the embodiment of the inventive elaboration method shown in FIG. 41.

Elaboration Method Step(b): Recursively Traversing Top-Level Statement Objects in Parse Tree Process Objects In accordance with the present invention, for each group of procedural statements (called a process) in "V" data base 230 (the parse tree), an "elab" method is carried out for the top-level statement object of that process. FIG. 42 shows a flowchart of the inventive "elab" method that is carried out as step(b) of the embodiment of the inventive elaboration method shown in FIG. 41. As shown in FIG. 42, at each statement object, the following steps are carried out by the "elab" method: step(a) [at 4200 of FIG. 42], setting "parent" and "previous" pointers of the statement object; [at 4210 of FIG. 42], determining whether the statement is an assignment statement or a conditional or block statement; step(b) for an assignment statement [at 4220 of FIG. 42], creating a net object and a conn object that connects to, and drives, the net object in "G" data base 260 (a conn object is said to "drive" its connected net object if the conn object connects the net to an output pin of a gate instance or module instance, or to an input port of the module), creating an update object, and updating the assignment statement's cache; step(c) for a conditional or a block statement [at 4230 of FIG. 42], recursing into each sub-statement object of the statement object; and step(d) [at 4240 of FIG. 42], propagating cache items upward to the statement object's "parent."

"Elab" Method Step(a): Setting "Parent" and "Previous" Pointers of a Statement Object In accordance with a preferred embodiment of the present invention, the "elab" method step(a) is started with two arguments, "incoming parent" pointer and "incoming previous" pointer. On the first use of the "elab" method for a top-level statement object for a parse tree process object, these incoming pointers are set to the root object of the process object. Then, the statement object's parent pointer is set to the "incoming parent" pointer, and the statement object's previous pointer is set to the "incoming previous" pointer.

Figure 43:
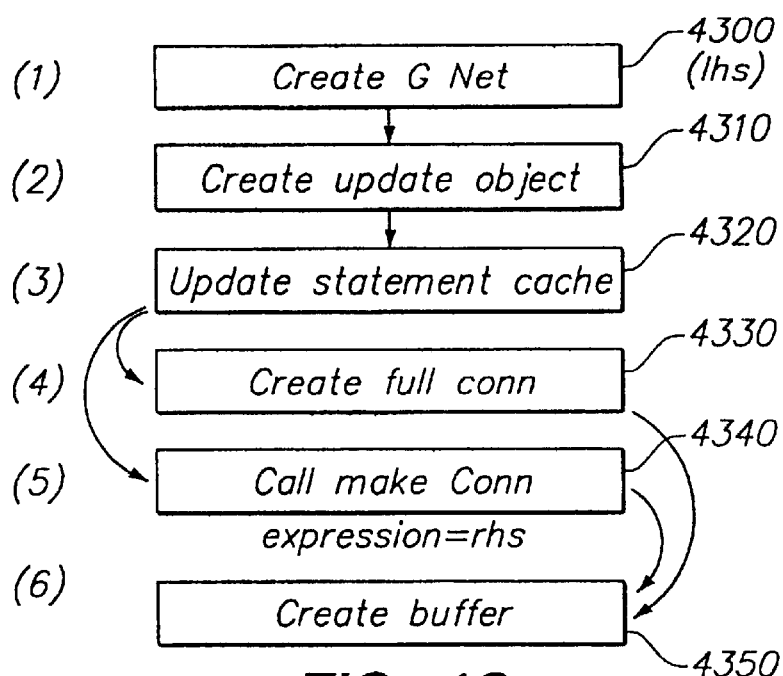
FIG. 43 shows a flowchart of an embodiment of inventive "elab" method step(b)

"Elab" Method step(b): Creating a Net Object and a Driver Object for Assignment Statement Objects FIG. 43 shows a flowchart of an embodiment of inventive "elab" method step(b). As shown in FIG. 43, inventive "elab" method step(b) comprises the following steps: (1) creating a net object in "G" data base 260 corresponding to the HDL identifier in the left-hand-side of the assignment statement [at step 4300 in FIG. 43]; (2) creating an update object corresponding to the HDL identifier in the left-hand-side of the assignment statement [at step 4310 in FIG. 43]; (3) updating the statement's cache [at step 4320 in FIG. 43]; (4) creating a full conn object for the net object [at step 4330 in FIG. 43]; (5) carrying out a makeConn method for the right-hand-side of the assignment statement [at step 4340 in FIG. 43]; and (6) creating a buffer gate object [at step 4350 in FIG. 43].

For an assignment statement object, after setting the "parent" pointer and the "previous" pointer, a net object is created and connected in "G" data base 260 in accordance with the following steps. In a first step for an assignment statement object, a net object is created in "G" data base 260 which has a bit-width equal to the width of the left-hand-side of the assignment statement object.

Figure 17:
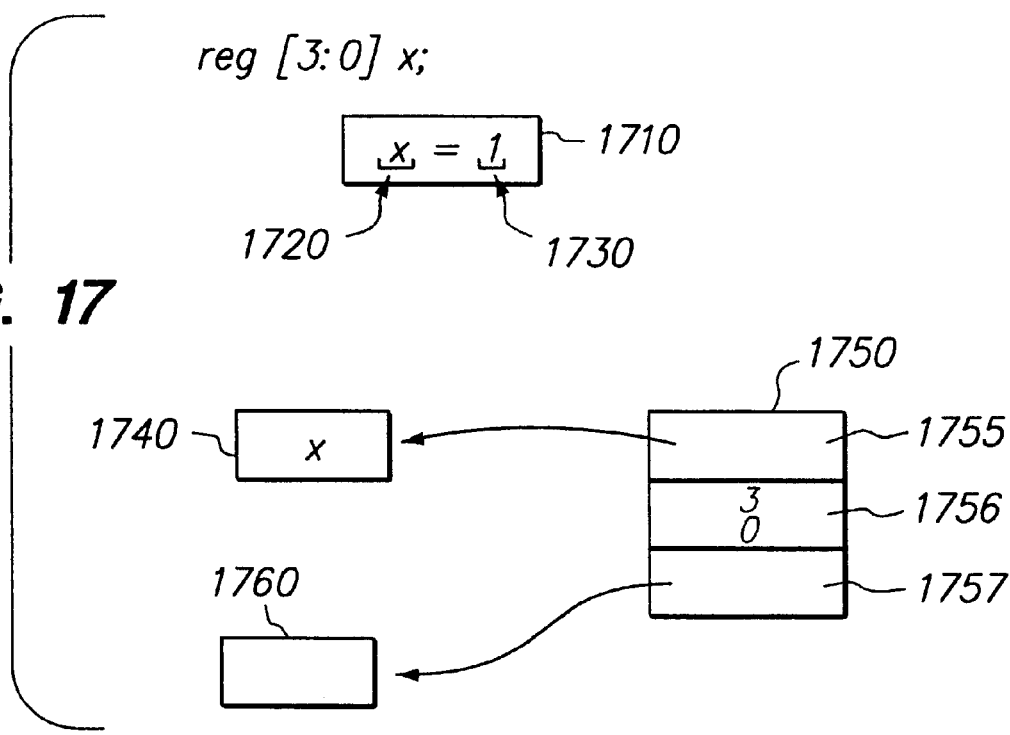
FIG. 17 shows an assignment statement using a 4-bit wide HDL identifier in a procedural HDL fragment written in Verilog and a corresponding update object.

Next, in a second step for an assignment statement object, an update object is created in "V" data base 230 which (as was described above in conjunction with FIG. 16) has three (3) data fields: (a) a pointer to the parse tree object that represents the HDL identifier on the left-hand-side of the HDL assignment statement; (b) a chunk object that represents a portion of the HDL identifier selected for assignment by a bit-select or part-select operator in the HDL assignment statement, and (c) a pointer to the net object in "G" data base 260 that is created in the first step to represent the left-hand-side of the assignment statement. As one can readily appreciate from this, each assignment statement object is associated with an update object. The update object is associated with the assignment statement object by creating a pointer in the assignment statement in "V" data base 230 to the update object. FIG. 17 shows an assignment statement in a procedural HDL fragment and a corresponding update object. As set forth in FIG. 17, HDL identifier 1720 (shown in the Verilog language declaration syntax set) is a 4-bit wide identifier.

In accordance with the present invention, data object 1740 in "V" data base 230 (the parse tree) represents HDL identifier 1720. As further shown in FIG. 17, 'x' is assigned to the value '1' in assignment statement 1710. As still further shown in FIG. 17, update object 1750 is created for left hand side 1720 of assignment statement 1710. In accordance with the present invention, update object 1750 comprises: (a) pointer 1755 to data object 1740 in "V" data base 230; (b) chunk 1756 representing the range of bits updated by assignment statement 1710 (i.e., bits 3 to 0); and (c) pointer 1757 to object 1760 in "G" data base 260, which object 1760 is a bussed net object created according to the rules of structural elaboration of right-hand-side 1730 of assignment statement 1710 discussed above.

At this point in the inventive elaboration method, "G" data base 260 has been partly populated with data objects representing the left-hand-side of the assignment statements, and update objects have been completed and attached to the assignment statement objects in "V" data base 230 (the parse tree).

Next, in a third step for an assignment statement object, the assignment statement object's cache item is updated with the contents of the update object to provide an updated chunk list. As was described above, the cache for each statement contains a set of cache items, one set of cache items for each unique HDL identifier updated within any statement enclosed in that statement. For each HDL identifier, the cache item corresponding to that HDL identifier contains a chunk list that represents the set of bits of the HDL identifier that are updated within any statement enclosed in that statement. In one embodiment of the third step, the cache item corresponding to the HDL identifier in the update object is located by using a hash table lookup method in the cache of the assignment statement, the hash index being based on the HDL identifier name string. It should be clear that any one of the many methods of retrieving information that are well known to those of ordinary skill in the art could have been used instead of a hash table lookup method. If a cache item that corresponds to the HDL identifier string does not exist in this cache, a cache item is created. The chunk contained in the update object is merged with the chunk list for this cache item in accordance with the detailed discussion of the merge operation above in conjunction with FIG. 22. As a result, and in accordance with this embodiment of the present invention, the cache item maintains a minimal representation of the complete set of bits of its associated HDL identifier that are written in any statement enclosed by the statement that owns the cache item.

Next, in a fourth step for an assignment statement object, a "full-conn" object is created in "G" data base 260 for the net object created in "G" data base 260 in the first step for an assignment statement object described above. This full-conn object represents a complete (full bit-width) connection to the net object and, in accordance with the present invention, will be used to connect the gate that drives this net.

Next, in a fifth step for an assignment statement object, a "makeConn" method is carried out for the right-hand-side of the assignment statement to create conn objects. The type of conn object created by the makeConn method is arbitrary, i.e., it can be a constant conn, a full conn, a bit-select conn, a part-select conn, or a concat conn. In fact, in accordance with the present invention, and as will described in detail below, the makeConn method may create additional net and gate objects.

The purpose of the makeConn method is to find or make a netlist connection that corresponds to the functionality of a given expression at the given location in the statement tree. The same HDL expression may occur at different points in the HDL statement tree, and each occurrence may have a different functional meaning, as determined by the semantics of the HDL language. Therefore, the inputs to the makeConn method include not only the HDL expression, but also the containing HDL statement. The output of this method is a conn object.

Figure 44A:
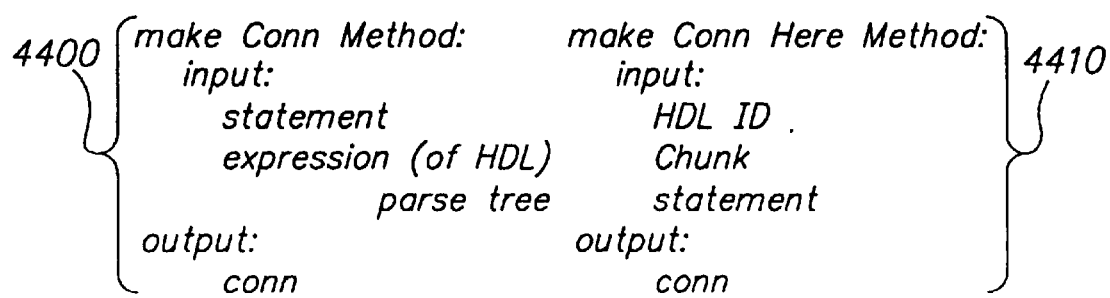
FIG. 44 a shows functions associated with inventive makeConn and MakeConnHere methods.
FIG. 44B shows a flowchart of an embodiment of inventive makeConn and makeConnHere methods.
Figure 44B:
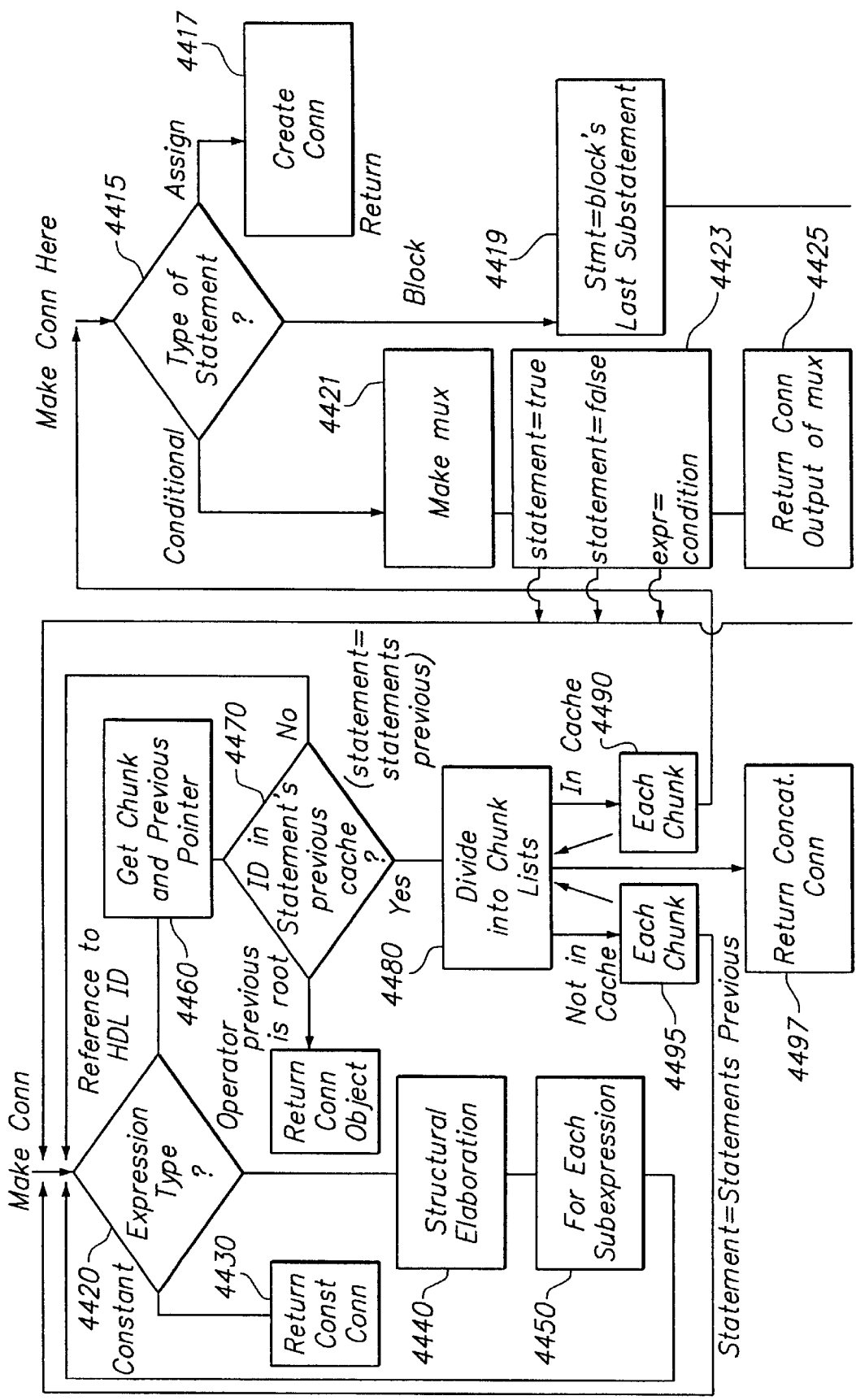

FIG. 44B shows a flowchart of an embodiment of the inventive makeConn and makeConnHere methods. The left-hand side of FIG. 44B shows the makeConn method, which can recurse on itself or call the makeConnHere method as a submethod. The right hand side of FIG. 44 shows the makeConnHere sub-method, which can recurse back to the makeConn method.

The task of finding or making a connection that represents an HDL expression at a location in the HDL statement tree is divided between the makeConn and makeConnHere methods as follows. The makeConn method is responsible for traversing upwards in the statement tree (via the statement parent pointers previously established) until it finds the nearest statement that encloses a statement which updates an identifier. The makeConn method also handles constant and structural expressions. The makeConnHere method is responsible for traversing downwards from a statement known to contain an update of an HDL identifier, into the sub-statements.

A high-level description of FIGS: 44A and 44B is given first, and then a detailed description. The makeConn method is called at the point in the elaboration algorithm when the logic function representing an HDL expression is requested. An HDL expression may consist of constants, references to HDL identifiers, and operators that perform functions on sub-expressions. Box 4420 shows the decision process for these expression types, in which a constant expression causes a constant connection object to be returned immediately (note that the function of a constant HDL expression does not depend on its location in the HDL statement tree). An HDL expression that is an operator can be broken down using the same techniques as in structural elaboration, with a call to makeConn for each of its sub-expressions. The structural elaboration method also does not depend on the location of the expression in the statement tree; however, the result of the makeConn calls for each of its sub-expressions will.

If the expression is found to be a reference to an HDL identifier in box 4420, then a traversal of the statement tree is required. This is because an HDL identifier appearing on the right-hand side of an assignment statement in an HDL statement tree is a placeholder for the value obtained by the most recent update of that identifier. For example, if the HDL statement "y=x" occurs in the middle of a statement tree, then the value of "x" that is assigned to "y" depends on the statement that last updated "x", as determined by a semantic model of execution of the statement tree from top-to-bottom. This is the same as in evaluation of a traditional programming language such as the C programming language. However, a complexity of hardware description languages as compared to traditional programming languages is the vector nature of HDL identifiers. There may be many most recent HDL statements that updated the value of "x" because each may have updated a different bit-range of "x". Handling the complexity of partial-bit updates is the work performed in box 4480.

The overall traversal behavior of FIG. 44A is as follows. Recall that the cache for each statement records all of the HDL identifiers that are updated (for any bit range) by that statement or by any statement enclosed recursively within that statement. For example, a block statement's cache will contain entries for the HDL identifier updated by an assignment statement within an 'if' statement within the block statement. Box 4470 repeatedly requests the makeConn method for a statement's previous statement until it finds a statement that has the requested HDL identifier in its cache. At that point, the upwards traversal is suspended and a makeConnHere method call is made with the input argument to the makeConnHere method being the statement having the cache item. This statement may be an assignment statement (box 4415) in which case the final connection is known, and can be returned, or it may be a conditional or block statement in which case further traversal is required, by means of the makeConn method.

An explanation of box 4480 and the iteration described in 4495 and 4490 is as follows. When a request is made for a given chunk of an HDL identifier, it may be that the statement's cache contains an update of some bits of that chunk, but not all requested bits. In such a case, to maintain the advantages of the vector nature of the present invention, the requested chunk is divided into a list of sub-chunks, having as few sub-chunks as possible, each of which is either completely contained in the statement's cache or completely not contained in the cache. Those sub-chunks that are contained in the cache cause a call to makeConnHere. Those sub-chunks that are not contained in the cache cause a call to makeConn, to cause an upwards traversal, just as occurs for HDL identifiers that are not in the cache at all. The results of these calls to makeConn and makeConnHere for each sub-chunk are put together into a concat conn and returned. In other words, the vector processing nature of the present invention is interrupted by partial bit-updates in the user's HDL, but only to the extent of the vector nature of the partial-bit updates. Partial-bit updates do not cause a complete loss of the vector efficiencies of the elaboration algorithm.

As shown in FIG. 44A, the makeConn method is embodied as function 4400 whose input is a right-hand-side statement expression of the HDL parse tree and whose output is a conn object. As still further shown in FIG. 44A, the makeConnHere method is embodied as function 4410 whose input is an HDL identifier, a chunk, and a right-hand-side statement, and whose output is a conn object.

In accordance with the present invention, as shown in FIG. 44A, upon entry to the makeConn method, at decision box 4420, a determination is made regarding the type of statement expression that has been applied as input. If the determination at decision box 4420 finds that the HDL statement expression type is a constant, then the makeConn method transfers control to box 4430. At box 4430, a const-conn object is created in "G" data base 260, and control is returned to the step that invoked the method.

If the determination at decision box 4420 finds that the HDL statement expression type is an operator (i.e., a logic expression such as "+", "−", "AND", "OR", and so forth), then the makeConn method transfers control to box 4440. At sponds to the operator is created in "G" data base 260, and control is transferred to box 4440. At box 4450, a recursive call is made to the makeConn method for sub-expressions of the operator attached to the inputs of the gate object.

If the determination at decision box 4420 finds that the HDL statement expression is a reference to an HDL identifier, then the makeConn method transfers control to box 4460. At box 4460, a chunk of the HDL identifier is computed based on the HDL expression ("expression chunk"), such that the bits indicated by the HDL identifier bit-select, part-select, or full HDL identifier reference are represented by this chunk. Next, the statement object's previous pointer is obtained and control is transferred to decision box 4470. At decision box 4470, if the previous pointer points to the root statement object, then a conn object (of the appropriate bit width) connected to the net object in "G" data base 260 that corresponds to the HDL identifier is created. If the previous pointer does not point to the root statement object, then the statement object that is pointed at by the previous pointer is examined for a chunk of the HDL identifier. This is done by searching the cache of the statement object that is pointed at by the previous pointer to see if any statement objects enclosed within that statement object assign the HDL identifier. If any statement objects enclosed within the statement object assign the HDL identifier, control is transferred to box 4480; otherwise, the makeConn method is again called with the statement object that is pointed at by the previous pointer as input, i.e., control is transferred to decision box 4420. At box 4480, a list of chunks that represent sub-ranges of the expression chunk is computed. For each sub-ranges of the expression chunk that are assigned within this statement object, control is transferred to box 4490. For all sub-ranges of the desired chunk that are not assigned within this statement object, control is transferred to box 4495. At box 4490, control is transferred to the makeConnHere method for each of the specific sub-ranges of the expression chunk, expressed as a chunk. At box 4495, the makeConn method is again called with the statement object that is pointed at by the previous pointer as input, i.e., control is transferred to decision box 4420. Lastly, control is transferred to box 4497 where a new concat conn object is created that contains all of the resulting conn objects from the sub-ranges that are assigned within this statement object and those that are not.

In accordance with this embodiment of the present invention, as shown in FIG. 44, upon entry to the makeConnHere method, at decision box 4415, a determination is made based on the type of statement. If the statement is an assignment statement, control is transferred to box 4417; if the statement is a conditional statement, control is transferred to box 4421; and if the statement is a block statement, control is transferred to box 4419.

At box 4417, for an assignment statement object, the makeConnHere method creates a conn object to the net object in "G" data base 260 recorded in the assignment statement object's update object. As described above, each assignment statement object owns an update object for the left-hand-side of the assignment statement object (as will be described in detail below, a logic buffer gate object in "G" data base 260 is created to drive the net object in "G" data base 260 associated, for the left-hand-side of the assignment statement object, with the conn associated with the makeConn method called on the assignment object's right-hand-side). Then, control is returned to the makeConn method from the point at which the makeConnHere method was invoked.

At box 4419, for a block statement object, the makeConstatement object of the block's sub-statement objects by resetting the statement and transferring control to the entry point of the makeConn method.

At box 4421, for a conditional statement object, the makeConnHere method creates a multiplexor object, and transfers control to box 4423. At box 4423, the makeConnHere method transfers control to: (a) the entry point of the makeConn method for the 'true' branch of the conditional statement object to be connected to the '1' input of the multiplexor object in "G" data base 260; (b) the entry point of the makeConn method for the 'false' branch of the conditional statement to be connected to the '0' input of the multiplexor object in "G" data base 260; and (c) the entry point of the makeConn method for the conditional expression in the HDL statement to be connected to the selector input of the multiplexor object in "G" data base 260. Then, control is transferred to box 4425. At box 4425, a conn object for the output of the multiplexor object is created and connected there. Finally, control is returned to the makeConn method from the point at which the makeConnHere method was invoked.

Figure 26:
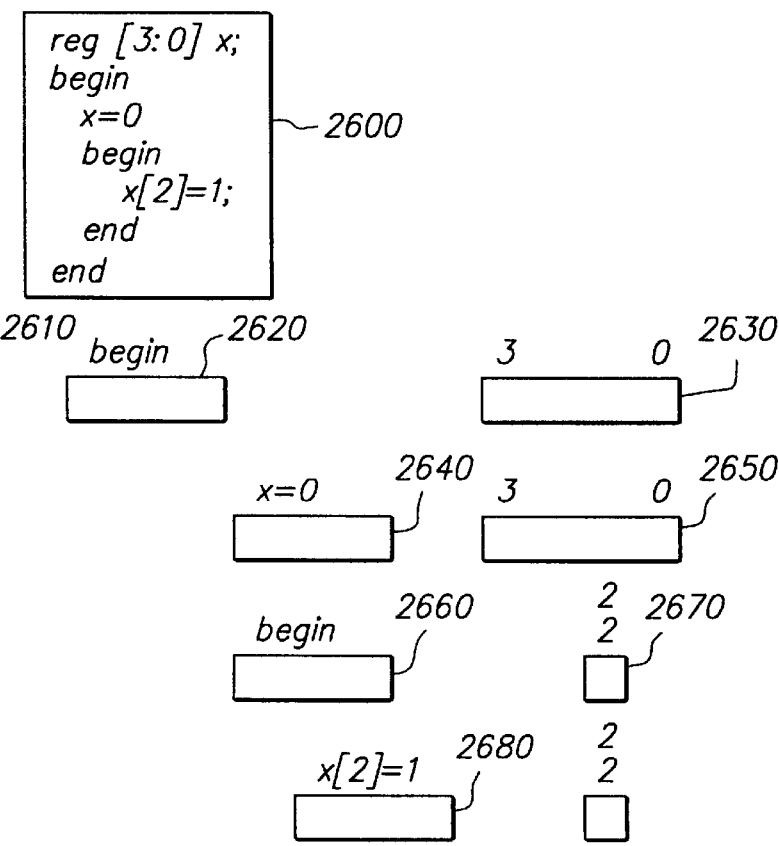
FIG. 26 shows, an HDL fragment which comprises a 4-bit wide HDL identifier 'x' that is initialized to all 0.

The above-described makeConn and makeConnHere methods are described in conjunction with FIG. 26. FIG. 26 shows, HDL fragment 2600 which comprises 4-bit wide HDL identifier 'x' that is initialized to all 0. Then, as further shown in HDL fragment 2600 of FIG. 26, bit position 2 is overwritten by a 1 value. In accordance with the present invention, the final value of the chunk 3:0 of 'x' is extracted as follows. Root statement object 2610 passes the makeConn request to outermost block statement object 2620, which checks its cache, i.e., cache item 2630. Cache item 2630 indicates that the complete range of 3:0 is "assigned to" in some statements enclosed within block statement object 2620, which checks its cache, i.e., cache item 2630. As a result, the makeConn method [at box 4490 in FIG. 44] passes the chunk 3:0 to the makeConnHere method for block statement object 2620 corresponding to cache item 2630. As a result, the makeConn method [at box 4490 in FIG. 44B] passes the chunk 3:0 to the makeConnHere method for block statement object 2620. makeConnHere method for block statement 2620 [at box 4479 in FIG. 44B] results in a recursive call to the makeConn method with the last sub-statement object in block statement object 2620's immediate sub-statement object list, namely statement object 2660, as input. As a result, the makeConn method [at box 4497 in FIG. 44B], checks the cache of statement object 2660, i.e., cache item 2670, and forms a concat conn object—chunk 3:3 is not written within the sub-statement objects of statement object 2660 and, therefore, is passed to its previous statement object 2640; chunk 2:2 is written within the sub-statement objects of statement 2660 and, therefore, is passed to statement object 2680; and chunk 1:0 is passed to statement object 2640. The makeConn method [at box 4430 in FIG. 44B] for statement object 2680 creates a const conn object for logic1. The makeConn method for statement 2640 [at box 4430 in FIG. 44B] similarly creates a const conn object for logic0, the 3:3 chunk conn object is 1-bit wide, and the 1:0 chunk conn object is 2-bits wide. Finally, the makeConn method [at box 4497 in FIG. 44B] creates a concat conn object of 1-bit 0 for position 3, 1-bit 1 for position 2, and 2-bits of 0 for positions 1 and 0.

It is important to note that, in accordance with the present invention, the steps of creating conn objects for bits 1 and 0 were never broken into separate creations, one for each bit, but instead, in accordance with the present invention, were treated as a vector creation, using chunk data to indicate the desired subset. This is contrasted with prior art logic synthesis elaboration which uses a bit-blasting method to handle such special cases. In such a prior art method, all bits would cause a separate traversal in the statement (or control-flow-graph) hierarchy. This is a key to the efficiency of the inventive method, because the complexity of the logic synthesis method in memory consumption and runtime is proportional to the number of exceptions, not the overall bit-width (and the number of exceptions is small in typical designs as compared with the overall bit width). For example, in FIG. 26, if the bit-width of the identifier 'x' had been 64 instead of 4, there would have still been only three (3) makeConn method requests: (a) one for a 63:3 chunk; (b) one for a 2:2 chunk; and (c) one for a 1:0 chunk. In contrast, in a prior art bit-oriented elaboration method there would be 64 makeConn method requests, regardless of the number of exceptions.

Next, in a sixth step for an assignment statement object, a buffer gate object is created in "G" data base 260 with the output of the buffer gate object being set to the full-conn object created in the fourth step for an assignment statement, and the input of the buffer gate object being set to the conn object created in the fifth step for an assignment statement object.

Figure 27:
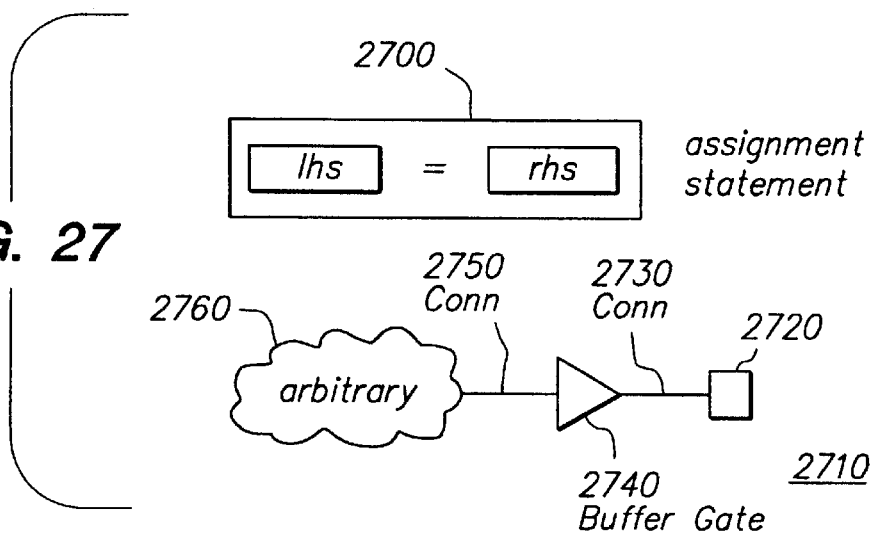
FIG. 27 shows, in schematic form, the results of the first to sixth steps of the "elab" method step(b) for an assignment statement object in accordance with the present invention.

FIG. 27 shows, in schematic form, the results of the first to sixth steps described above for an assignment statement object. As shown in FIG. 27, assignment statement 2700 in HDL 210 has been converted to structure 2710 in "G" data base 260 wherein: (a) net object 2720 was created in the first step for an assignment statement object [of "elab" method step(b): creating a net object and a driver object for assignment statement objects]; (b) conn object 2730 was formed in the fourth step for an assignment statement object [of "elab" method step(b): creating a net object and a driver object for assignment statement objects]; (c) buffer gate object 2740 was formed in the sixth step for an assignment statement object [of "elab" method step (b): creating a net object and a driver object for assignment statement objects]; and (d) conn object 2750 was formed in the fifth step for an assignment statement object [of "elab" method step (b): creating a net object and a driver object for assignment statement objects].

"Elab" Method Step(c): Recursing into each Sub-statement Object of a Statement Object This step only applies to statement objects that have sub-statement objects, i.e., block statement objects and conditional statement objects (assignment statement objects have no sub-statement objects). For block statement objects and conditional statement objects, the "elab" method shown in FIG. 42 is carried out for all sub-statement objects with the "incoming parent" pointer being set equal to this statement object. For block statement objects, the "incoming previous" pointer is set as follows. The first sub-statement object in the block statement object has its "incoming previous" pointer set to the "incoming previous" pointer that this block statement object was called with (i.e., it is just passed on to a deeper statement object). For sub-statement objects after the first sub-statement object in the block statement object, the "elab" method is carried out with the "incoming previous" pointer set to the previous sub-statement object in the block. The second sub-statement object gets its "incoming previous" pointer set to the first sub-statement object, and so forth. For conditional statement objects, the "elab" method is carried out for both true and false sub-statement objects with its "incoming previous" pointer set to the "incoming previous" pointer the conditional statement object was called with.

"Elab" Method Step(d): Propagate Cache Items Upwards to the Statement Object's "Parent"

In this step, the chunk list of each cache item in a statement object's cache is merged with the chunk list of cache items in the cache of the statement object's parent statement as follows. For each cache item in the statement object's cache, a search is made for a cache item in the parent statement object by using a hash table lookup method, the hash index being based on the HDL identifier associated with the cache item in the statement object's cache. It should be clear that any one of the many methods of retrieving information that are well known to those of ordinary skill in the art could have been used instead of a hash table lookup method. If a cache item that corresponds to the HDL identifier does not exist in the parent statement object, then one is created to represent this HDL identifier. Each chunk in the cache item's chunk list is merged into the chunk list in the parent statement object's cache item which was just found or created. This merge operation is identical to that illustrated in FIG. 22 above and in Elaboration Method step(b). This step is the method by which it is ensured that the cache of each statement contains a chunk list that has been updated by any statement enclosed within that statement, recursively, because as each cache is filled in bottom-up fashion, it merges its own contents with the cache above it.

Elaboration Method Step(c): Connecting Net Objects in "G" Database 260

At this point, in accordance with the inventive method, in "G" data base 260, net objects have been created for each assignment statement in HDL 210, and each of these net objects is driven by gate objects that connect to other such created net objects or primary inputs to the module. However, no connections have been made to the net objects of the module that connect to module output ports. This is done for each process in the module as follows. For each cache item in the cache of the process's root statement object: (a) find a net object that corresponds to the cache item's HDL identifier; (b) create a conn object to drive the net object; (c) carry out a "makeConn" method; and (d) create a buffer gate object.

Connection Method Step(a): Finding a Net Object Corresponding to the Cache Item's HDL Identifier In accordance with a preferred embodiment of the present invention, the net object corresponding to the HDL identifier in the cache item is located in a "G" module object hash table using a hash table lookup method, the hash index being based on the HDL identifier name. It should be clear that any one of the many methods of retrieving information that are well known to those of ordinary skill in the art could have been used instead of a hash table lookup method.

Connection Method Step(b): Creating a Conn Object to Drive the Net Object

This connection method step(b) is similar to the first step for an assignment statement object [of "elab" method step (b): creating a net object and a driver object for assignment statement objects] described above, i.e., a "full-conn" object is created for the net object returned in connection method step(a).

Connection Method Step(c): Carrying Out a "MakeConn" Method

This connection method step(c) is similar to the fifth step for an assignment statement object [of "elab" method step (b): creating a net object and a driver object for assignment statement objects] described above, i.e., the "makeConn" method is carried out for the process top-level statement object. This results in an upwards traversal of the complete parse tree to return a conn object. Note that the fifth step for an assignment statement object [of "elab" method step(b): creating a net object and a driver object for assignment statement objects] described above is used to generate logic at an arbitrary intermediate point in the parse tree, but this step in the connection method is used to generate final logic at the end of the parse tree.

Connection Method Step(d): Creating a Buffer Gate Object

This connection method step(d) is similar to the sixth step for an assignment statement object [of "elab" method step (b): creating a net object and a driver object for assignment statement objects] described above. A buffer gate object is created with the output of the buffer gate object being set to the conn object created in connection method step(b), and the input of the buffer gate being set to the conn object created in connection method step(c).

Figure 28:
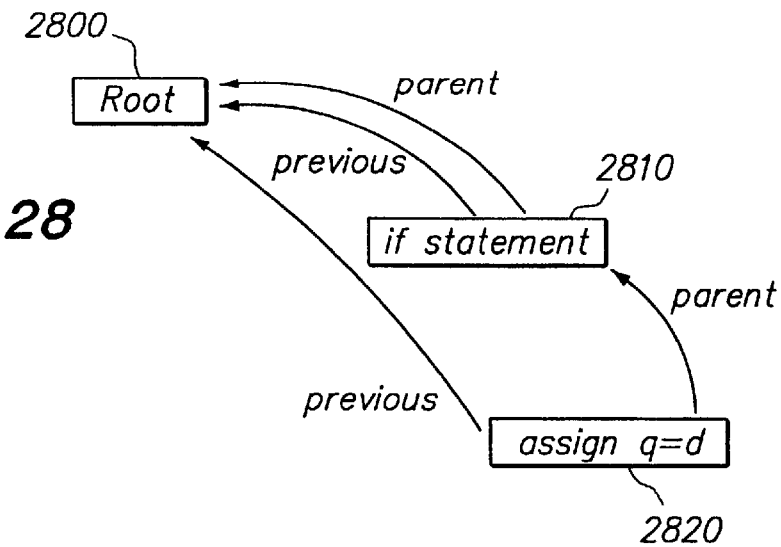
FIG. 28 shows, in schematic form, a representation in "V" data base (the parse tree) for the HDL block shown in FIG. 3B.
Figure 29:
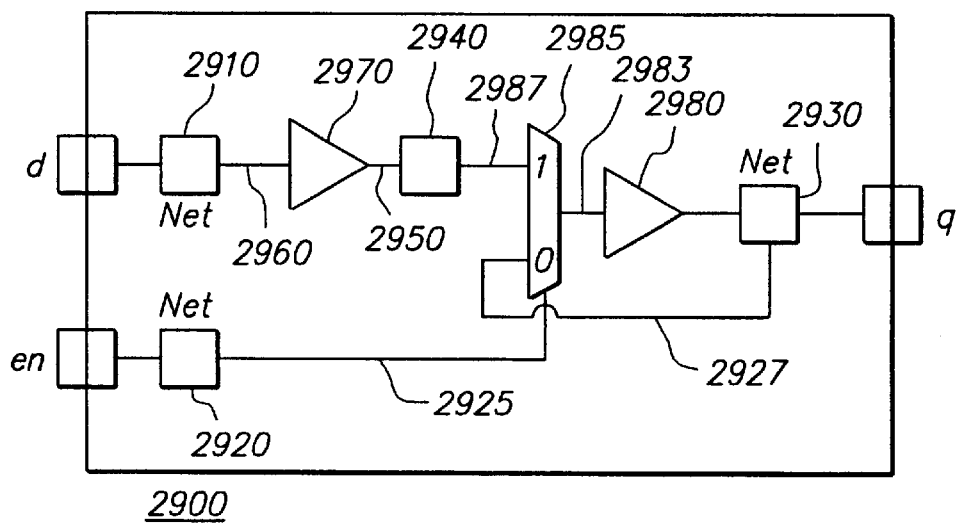
FIG. 29 shows, in schematic form, a representation in "G" data base for the HDL block shown in 3B.

The following describes the inventive elaboration method as applied to Verilog HDL that represents the function of a latch, which Verilog HDL is shown in FIG. 3B. FIG. 28 shows, in schematic form, "V" data base 230 (the parse tree) for the HDL shown in FIG. 3B and FIG. 29 shows, in schematic form, "G" data base 260 for the HDL shown in 3B.

In accordance with "Elaboration Method step(a): preprocessing" described above, and as shown in FIG. 29, net objects 2910, 2920, and 2930 are created and are attached to module ports "d", "en" and "q", respectively.

In accordance with "Elaboration Method step(b): recursively traversing top-level statement objects in parse tree process objects" described above, traversing starts with carrying out the "elab" method described above for if statement object 2810 of FIG. 28. In accordance with ""elab" method step(a): setting "parent" and "previous" pointers for a statement object," since the "incoming parent" pointer and the "incoming previous" pointer of if statement object 2810 are both root object 2800, in accordance with the present invention, the "parent" pointer and the "previous" pointer of if statement object 2810 are both set to root object 2800. ""elab" method step(b): creating a net object and a driver object for assignment statement objects" does not apply to if statement object 2810 since it is a conditional statement object. In accordance with ""elab" method step (c): recurse into each sub-statement object of a statement object," "elab" method step(a)" is carried out for "true" sub-statement object 2820 (the parse tree object for assignment statement 333 of FIG. 3B) by setting its "incoming parent" pointer to if statement object 2810 and its "incoming previous" pointer to root object 2800.

In accordance with ""elab" method step(b): creating a net object and a driver object for assignment statement objects," for "true" sub-statement object 2820, in a first step for an assignment statement object (as was described in detail above), net 2940 is created to represent the left-hand side "q" of assignment statement object 2820. In accordance with a second step for an assignment statement object (as was described in detail above), an update object is created having a pointer to HDL identifier object "q", a chunk having msb=0 and lsb=0 (HDL identifier object "q" is a scalar in this example), and a pointer to net object 2940. In accordance with a fourth step for an assignment statement object (as was described in detail above), full conn object 2950 is created. In accordance with a fifth step for an assignment statement object (as was described in detail above), conn object 2960 is created, which conn object 2960 is a reference to "d" net 2910. In accordance with a sixth step for an assignment statement object (as was described in detail above), buffer gate object 2970 is created.

As was described above, ""elab" method step(c): recurse into each sub-statement object of a statement object," has no action for assignment statement object 2820. In accordance with ""elab" method step(d): propagate cache items upwards to the statement object's "parent", " the cache item for assignment statement object 2820 "q" is merged with the cache item for if statement object 2810.

In accordance with ""elab" method step(d): propagate cache items upwards to the statement object's "parent"" for if statement object 2810, the cache item of if statement object 2810 is merged with the cache item of the process root statement object.

Now that "Elaboration Method step(b): recursively traversing top-level statement objects in parse tree process objects" is complete, "Elaboration Method step(c): connecting net objects in "G" database 260" is carried out for the cache items in the cache of process root object. In accordance with "connection method step(a): find a net object corresponding to the cache item's HDL identifier," net object 2930 is found (this is the net object corresponding to the "q" identifier in the cache item). In accordance with "connection method step(b): create a conn object to drive the net object"; "connection method step(c): carry out a "makeConn" method"; and "connection method step(d): create a buffer gate object"; buffer gate object 2980 and its connections as shown are created.

"connection method step(c): carry out a "makeConn" method" just above carries out a makeConn method on the parse tree object 2810 for top-level statement object in the process, if statement object 2810. In accordance with the makeConn call method, a check is made to determine if the requested identifier "q" is in the cache. It is, and therefore a makeConnHere method is carried out for if statement object 2810. In accordance with the detailed description above, for an if statement object, carrying out the makeConnHere method results in the creation of multiplexor (mux) object 2985. The selector of mux object 2985 is the result of carrying out the makeConn method on the conditional expression, resulting in conn object 2925 connecting to net object 2920 (the net object for the "en" signal). The "true" data input of mux object 2985 is the result of carrying out the makeConn method on the "true" sub-statement object (in this case assignment statement 2820), which results in conn object 2987 connecting to net object 2940 which was created to represent the left-hand-side of assignment statement object 2820. The "false" data input of mux object 2985 is the result of carrying out the makeConn method on the "false" sub-statement (in this case there is no "false" sub-statement so the makeConn method is passed upwards in the parse tree to the root statement object, where it results in conn object 2927 connecting to net object 2930 which represents the designer's "q" identifier.

Advantageously, in accordance with the present invention, no special processing of the parse tree (nor of any control-flow-graph with edges) with knowledge of latch detection was required to produce netlist 2900 shown in FIG. 29. This netlist does not contain any latch gates. It does contain feedback paths which represent the function of the HDL.

Inferring Complex Components

A further aspect of the present invention relates to a novel method for inferring complex components such as, for example and without limitation, latches and tristates from a "G" data base. As will be described in detail below, one embodiment of the present invention for inferring complex components is an inventive method for inferring latches that comprises the steps of: (a) traversing a gate netlist; (b) for a net, identifying (1) a net driver, (2) feedback connections and (3) associated enable signals that cause the feedback connections; and (c) substituting a latch gate as the driver of the net, the latch gate having (1) a data-input connected to the net driver, (2) an enable-input connected to the associated enable, and (3) a data-output to drive the net. Further steps include inserting don't-care conditions to replace feedback connections. Another embodiment of the present invention for inferring complex components is an inventive method for inferring tristates that comprises the steps of: (a) traversing a gate netlist; (b) for a net, identifying (1) a net driver, (2) high-impedance constant connections, and (3) associated enable signals that cause the high-impedance constant connections; and (c) substituting a tristate gate as the driver of the net, the tristate gate having (1) a data-input connected to the net driver and (2) an enable-input connected to the associated enable, and (3) a data-output to drive the net. Further steps include inserting don't-care conditions to replace high-impedance constant connections.

Figure 45:
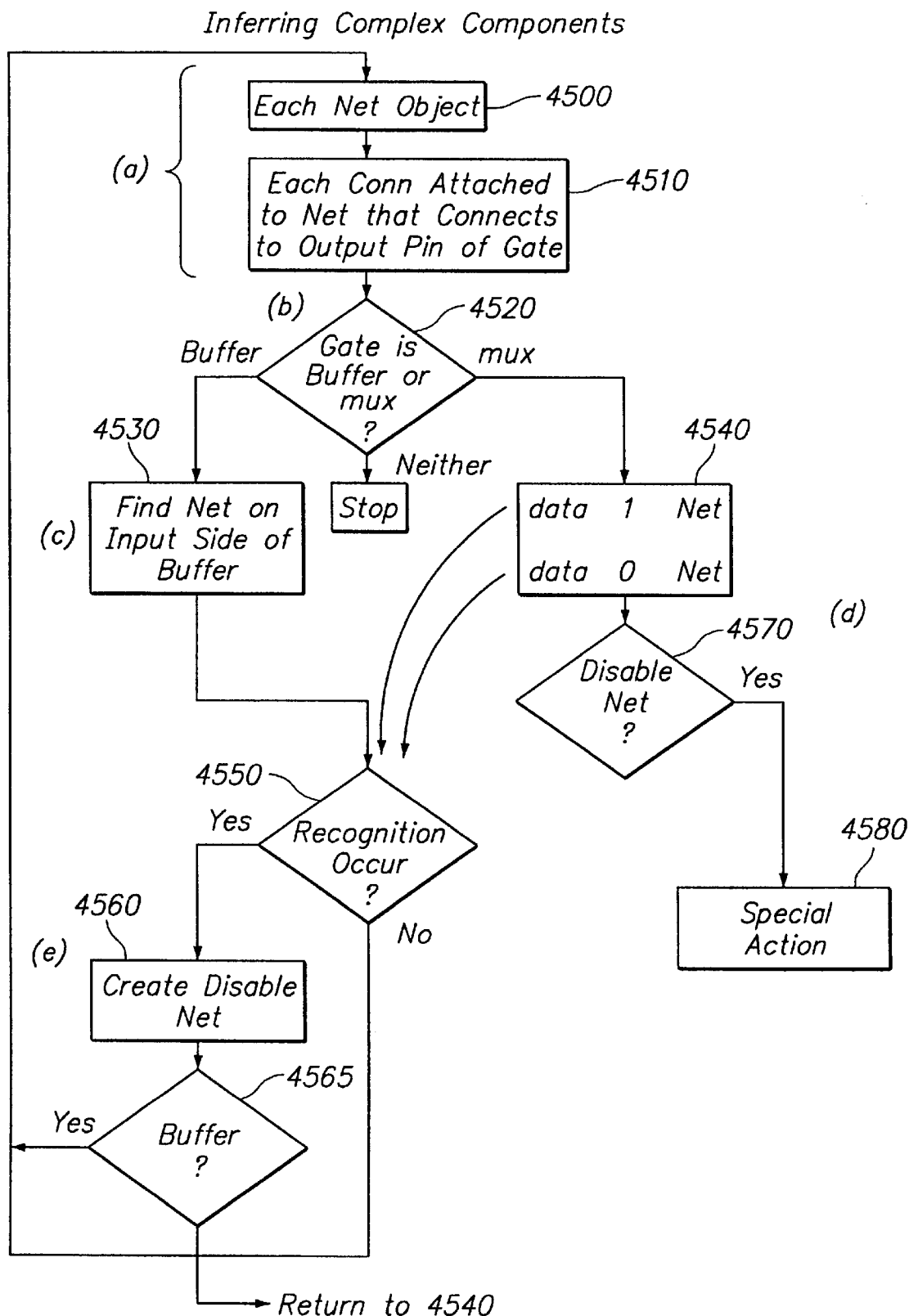
FIG. 45 shows a flowchart of an embodiment of an inventive method for inferring complex components.

FIG. 45 shows a flowchart of an embodiment of an inventive method for inferring complex components. In accordance with the inventive method of inferring complex components, "G" data base 260 is searched for configurations that represent a latch or tristate function. As shown in FIG. 45 at box 4500, for each net object in,"G" data base 260 that originated from a direct correspondence with an identifier in HDL 210 (i.e., a net object created in "Elaboration Method step(a): preprocessing"), control is transferred to box 4510 to carry out "Inferring Complex Components: step(a)." The original net object is called the "target net" and does not change for the step of traversing from the target net. There are two modes of operation: one for a latch and one for a tristate. First, the inventive method is carried out for latches, then for tristates.

Inferring Complex Components: Step(a)

As shown in FIG. 45 at box 4510, for all conn objects attached to this net object and, in particular, for conn objects that connect to output pin objects of gate objects, i.e., driving connections (as opposed to conn objects that connect to input pin objects of gate objects, i.e., loading connections), control is transferred to decision box 4520 to carry out "Inferring Complex Components: step (b)" on the gate object that connects to the conn object. If there is no such gate object, return NULL to indicate the end of the step of traversing.

Inferring Complex Components: Step(b)

As shown in FIG. 45, at decision box 4520, if the gate object is not a non-inverting buffer object or multiplexor (mux) object, then perform no action. If the gate object is a non-inverting buffer object, control is transferred to decision box 4530 to carry out "Inferring Complex Components: step(c)." If the gate object is a mux object, control is transferred to box 4540 to carry out "Inferring Complex Components: step(d)."

Inferring Complex Components: Step(c)

Figure 30:
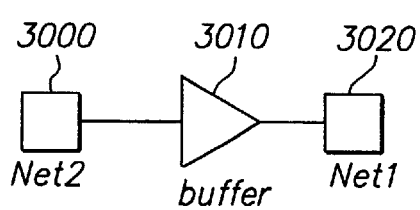
FIG. 30 shows, in schematic form, how net objects are connected to a buffer input pin conn object and a buffer output pin conn object, respectively.

FIG. 30 shows, in schematic form, net objects 3000 and 3020 that are connected to a buffer input pin conn object and a buffer output pin conn object, respectively. As shown in FIG. 45, at box 4530, in accordance with the present invention, find net 3000 that connects to the buffer input pin conn object, and transfer control to decision box 4550 to carry out "Inferring Complex Components: step(e)" on that net object. If a non-NULL "disable" net object is created, then a latch or a tristate has been recognized.

Inferring Complex Components: Step(d)

Figure 31:
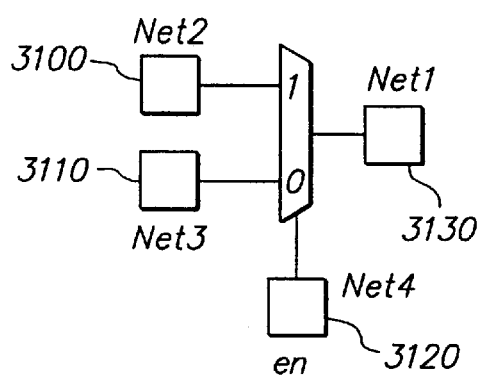
FIG. 31 shows, in schematic form, how net objects are connected to a data-1 input of a mux object and a data-0 input of the mux object, respectively.

FIG. 31 shows, in schematic form, net objects 3100 and 3110 that are connected to a data-1 input and a data-0 input of the mux object, respectively. As shown in FIG. 45, at box 4540, in accordance with the present invention, find net 3100 that connects to the data-1 input of the mux object, transfer control to decision box 4550 to carry out "Inferring Complex Components: step(e)" on that net object, then do the same for net object 3110 that connects to the data-0 input of the mux object. Control is then transferred to decision box 4570. As shown in FIG. 45, at decision box 4570, if either execution of step(e) returned a non-NULL "disable" net object, then a latch or tristate has been recognized, and control is transferred to box 4580 to take special action. The special action entails: (a) creating a mux gate object and attaching the "disable" net object returned from the operation of step (e) on net object 3100 to the data-1 input of the mux object and (b) attaching the "disable" net object returned from the operation of step(e) on net object 3110 to the data-0 input of the mux object. If either execution of step (e) returned "disable" net object is NULL, then a new net object driven to logic0 is created and used instead. A conn object from existing net object 3120 (enable net) is created to the newly created mux object. A new net object N2 is: (a) created, (b) connected to the output of the newly created mux object, and (c) returned as the "disable" net object. In addition, a special method step(d1) is carried out to modify "G" data base 260 for optimal propagation of don't care information.

Inferring Complex Components: Step(d1)

This is a sub-step for a mux object. If either "disable" net object from "Inferring Complex Components: step(e)" of traversing data-0 or data-1 returns a net object that is identically logic1, this means that the data is always disabled, and can be removed by replacing that data-0 or data-1 connection with the don't care ("x") constant conn object.

Inferring Complex Components: Step(e)

In accordance with the present invention, this step of the method is called with a specific net object called "this net" object. As shown in FIG. 45, at decision box 4550, a determination is made to see if a recognition has occurred. For the latch mode of operation, a recognition "occurs" if "this net" object is the same net object as the target net object. For the tristate mode of operation, a recognition "occurs" if "this net" object is high-impedance, i.e., has no driver objects. If a recognition occurs, control is transferred to box 4560. If a recognition does not occur, control is transferred to box 4500 to carry out "Inferring Complex Components: step(a)" for "this net" object. At box 4560, a buffer gate object is created with an input connected to a constant "1" conn object, and an output connected to a conn object which is connected, in turn, to a newly created net object N1 (the "disable" net object). If input to decision box came from box 4530, control is transferred to box 4500, otherwise, control is returned to decision box 4540.

Figure 32:
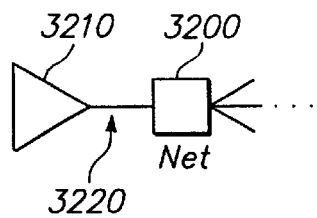
FIG. 32 shows, in schematic form, a portion of "G" data base before "Inferring Complex Components: steps (f) and (g)" have been carried out in accordance with the present invention.
Figure 33:
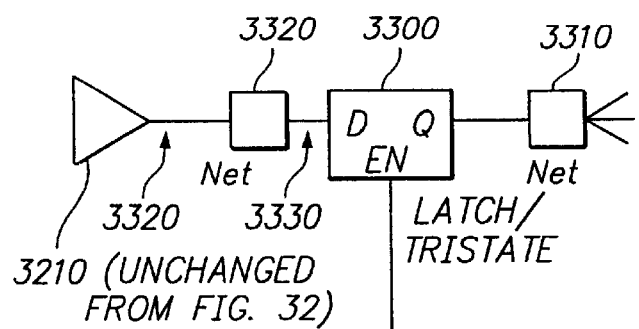
FIG. 33 shows, in schematic form, a portion of "G" data base after "Inferring Complex Components: steps (f) and (g)" have been carried out in accordance with the present invention.

After "Inferring Complex Components: steps (a)–(e)" have been carried out, the final "disable" net object is examined for each net object. If there is a "disable" net object returned that is non-NULL, the latch or tristate has been detected and the latch or tristate element must be inserted into "G" data base 260. This is accomplished in accordance with the following steps. FIG. 32 shows, in schematic form, a portion of "G" data base 260 before "Inferring Complex Components: steps (f) and (g)" have been carried out and FIG. 33 shows the portion of "G" data base 260 after "Inferring Complex Components: steps (f) and (g)" have been carried out. As shown in FIG. 32, net object 3200 is driven by gate object 3210, in this case a buffer gate object, and has loads (in this case three (3) loads to arbitrary gates).

Inferring Complex Components: Step(f)

In accordance with the present invention, as shown in FIG. 33, a latch or tristate gate object 3300 is created. Each of these gate objects have three pins: a data input, an enable, and a data output. Next, control is transferred to "Inferring Complex Components: step (g)." Note that net object 3310 of FIG. 33 is unchanged net object 3200 of FIG. 32.

Inferring Complex Components: Step(g)

In accordance with the present invention, as shown in FIG. 33, conn object is 3220 which drives net object 3200 (as shown in FIG. 32) is disconnected, new net object 3320 is created, and conn object 3320 is connected to drive net object 3320. Next, conn object 3330 is created to connect net object 3320 to latch or tristate data input marked "D" in FIG. 33.

Next, inverter gate object 3340 is created, a conn object from "disable" net object 3350 (unchanged from FIG. 34) is attached to the input of inverter gate object 3340, and a conn object from the output of inverter.gate object 3340 is attached to newly created net object 3360. Next, a conn object from net object 3360 is attached to the enable input of the latch or tristate marked "EN" in latch or tristate gate object 3300. Next, a conn object from the latch or tristate output marked "Q" in latch or tristate gate object 3300 connects to net object 3310.

At this point in the method, a latch or tristate gate object has been created and connected in "G" data base 260 so that the functionality of the original has been preserved. The feedback loop (for latch mode) or high impedance (for tristate mode) has been replaced by paired don't care and latch/tristate gate, which together give the same functionality as the original due to the construction of the disable signal from the traversing step.

To understand the above, consider the following example for netlist 2900 show in FIG. 29 (which was generated from the HDL fragment shown in FIG. 3B). In accordance with the present invention, the step of traversing begins with "Inferring Complex Components: step(a)" carried out for net object 2930 ("q"), in latch mode. Net object 2930 is the target net object. "Inferring Complex Components: step(b)" is then carried out for gate object 2980, which is the driver of net object 2930. Gate object 2980 is a buffer gate object, so "Inferring Complex Components: step(c)" is carried out for buffer gate object 2980, which causes "Inferring Complex Components: step(e)" to be carried out for net object 2983, the net object that connects to the input of buffer gate object 2980.

The following describes carrying out "Inferring Complex Components: step(e)" on net object 2983: Since net object 2983 is not the target net object, this is not a recognition of a latch. Next, carry out "Inferring Complex Components: step(a)" for net object 2983. This results in "Inferring Complex Components: step(b)" being carried out for mux object 2985, which results in "Inferring Complex Components: step(d)" being carried out for mux object 2985. Next, "Inferring Complex Components: step(e)" is carried out: (a) for net object 2940 for data-1 input to mux object 2985 and (b) for net object 2930 for data-0 input to mux object 2985.

The following describes carrying out "Inferring Complex Components: step(e)" on net object 2940 (FIG. 29) which results in traversing through buffer gate 2970 and net object 2910. Since there is no gate object driving net object 2910, i.e., it is directly connected to a port object, "Inferring Complex Components: step(a)" during the traversing returns NULL.

The following describes carrying out "Inferring Complex Components: step(e)" on net object 2930 which results in a match with target net object 2930, and a return of a "disable" net object that is the constant logic 1 function.

Figure 34:
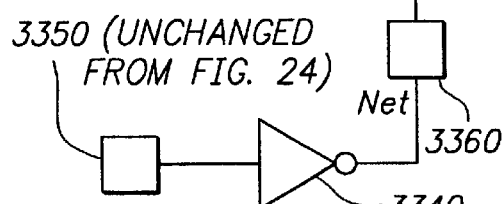
FIG. 34 shows, in schematic form, a newly created mux object wherein the inputs of the mux object are set to data-1 (constant 0) and data-0 (constant 1), i.e., the disable functions returned from carrying out "Inferring Complex Components: step (e)" in accordance with the present invention.
Figure 34:
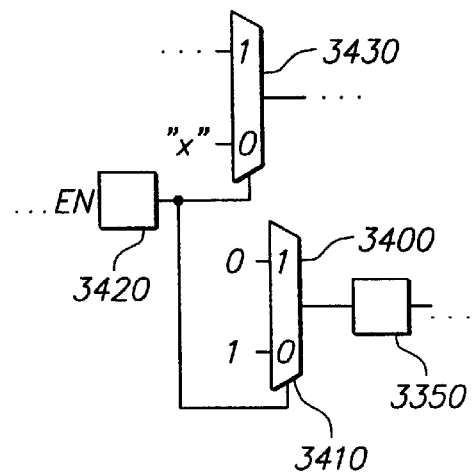

Returning to the description of carrying out "Inferring Complex Components: step(d)" for mux object 2985. The data-0 disable function is non-NULL, so a latch has been recognized. FIG. 34 shows, in schematic form, newly created mux object 3400 wherein the inputs of mux object 3400 are set to data-1 (constant 0) and data-0 (constant 1), i.e., the disable functions returned from carrying out "Inferring Complex Components: step(e)." Select input 3410 of mux object 3400 is connected to enable net object 3420 which is the same as net object 2920 of FIG. 29. A new 1-bit net object 3350 is created and the output of mux 3400 is connected to it. Net object 3350 will be returned as the disable net object from carrying out "Inferring Complex Components: step(d)."

In accordance with the present invention, after "Inferring Complex Components: step(d)" is carried out for mux object 2985, "Inferring Complex Components: step(d1)" is carried out. In this step, data-0 disable net object is a constant 1 (i.e., the disable net object returned from carrying out "Inferring Complex Components: step(e)" on net object 2930 connected to the data-0 input of mux 2985), so the data from that input is always disabled. In accordance with the present invention, the data-0 input to original mux object 2985 is "x" as shown for mux object 3430 of FIG. 34. The data-1 and output connections of mux object 3430 are unchanged from that shown for mux object 2985 of FIG. 29. The disable net 3350 of FIG. 34 is passed unchanged through the buffer gate 2980 in accordance with carrying out "Inferring Complex Components: step(c)," and becomes the final disable net object for the step of traversing "q" net 2930.

In accordance with the present invention, "Inferring Complex Components: step(f)" is now carried out for "q" net 2930. The final disable net object is non-NULL, so a latch has been detected and a latch must be inserted into the netlist, as discussed above in conjunction with FIGS. 32 and 33.

Figure 35:
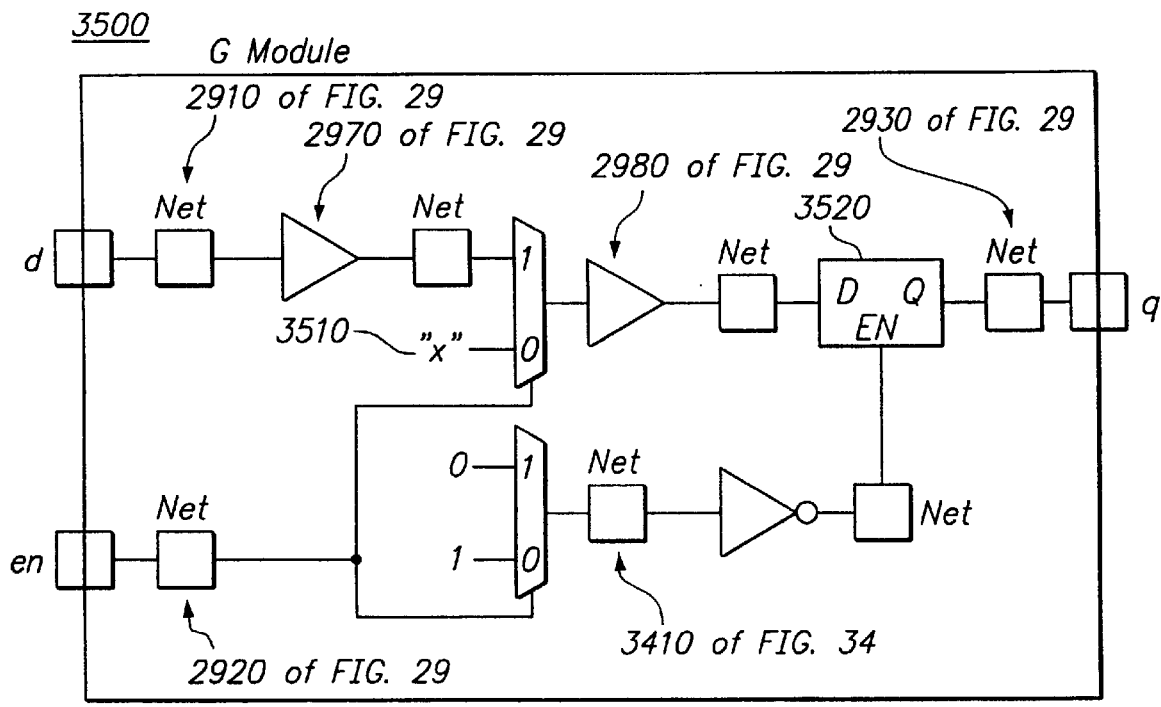
FIG. 35 shows, in schematic form, netlist 2900 shown in FIG. 29 after it has been transformed by carrying out "Inferring Complex Components: steps (a)–(g)" in accordance with the present invention.

At this point, netlist 2900 shown in FIG. 29 has been transformed into netlist 3500 of FIG. 35. In accordance with the present invention, mux object 2985 (FIG. 29) has been modified to have a don't care "x" 3510 on the data-0 input; a disable signal has been formed by creating a mux object; and latch object 3520 has been inserted in between buffer gate object 2980 and net object 2930.

Simplification of Net Objects in "G" Database 260

In accordance with the present invention, "G" data base 260 is simplified by performing simplification techniques which are well known to those of ordinary skill in the art to each gate object in "G" data base 260, repeatedly, until no such simplifications are possible. These prior art techniques include, without limitation, propagation of constants through logic gates and elimination of don't care constants, and are well-understood by those skilled in the art. As is well known to those of ordinary skill in the art, the function of the circuit is not changed by such transformations.

For example, a 2-to-1 mux object having a don't care "x" condition connected to one of its inputs can be simplified to a buffer gate object. Further, a buffer gate object can be simplified by removing the buffer gate object entirely, and replacing all connections of the buffer gate object output with its input. As is well known to those of ordinary skill in the art, since the buffer gate object is non-inverting, the logic function of the circuit is preserved. A 2-to-1 mux object with all constant data inputs can be simplified to a constant or buffer gate object or inverter of the select, according to the Boolean function. And two inverting buffer gate objects in series can be replaced with a non-inverting buffer gate object.

Applying the above simplifications to netlist 3500 shown in FIG. 35 provides much-reduced netlist 3600 shown in FIG. 36.

The final example is for the tristate. FIG. 37 shows a Verilog language model for a tristate driver. When the enable signal "en" is active (logic1), the output "q" is driven to the logic value of "d". When "en" is inactive (logic0), "q" is set to a high-impedance state. (The syntax "z" is used in the Verilog language to denote the special situation of high impedance—other HDLs use other similar means).

Figure 40:
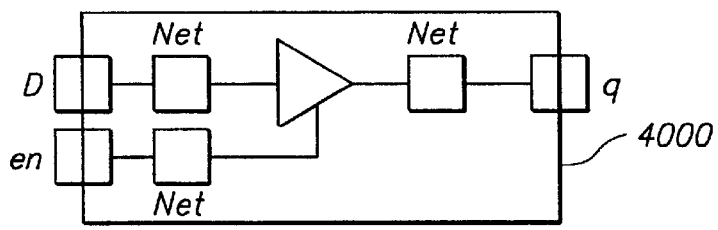
FIG. 40 shows, the netlist of FIG. 39 after carrying out simplification in accordance with the present invention.

Similar to the elaboration steps described above in conjunction with FIGS. 3B, 3C, and 27–29, the HDL model shown in FIG. 37 is elaborated to produce netlist 3800 shown in FIG. 38. After carrying out the inventive method of "Inferring Complex Components" described above, netlist 3800 is modified to netlist 3900 shown in FIG. 39. Note that this is almost identical to netlist 3500 shown in FIG. 3500, except that the latch is replaced by a tristate driver. Therefore, the simplification process is the same as that which produced netlist 3600 shown in FIG. 36 from netlist 3500 shown in FIG. 35. Netlist 4000 shown in FIG. 40 is the result of simplifying netlist 3900 shown in FIG. 39.

As one of ordinary skill in the art can readily appreciate from the above, the inventive method of inferring complex components for example and without limitations, latches and tristates, used for bit-oriented netlists as well as for word-oriented netlists.

It is well known to those of ordinary skill in the art how to traverse "G" data base 260 to create a logic netlist as output using any one of a number of methods that are well known to those of ordinary skill in the art.

It should be clear to those of ordinary skill in the art that the methods described above are embodied in software to be run on a computer, for example and without limitation, a general purpose computer. Further, using the detailed description provided above, those of ordinary skill in the art can fabricate embodiments of the inventive method using any one of a number of suitable programming languages that are well known such as, for example and without limitation, the C++ programming language (including versions of the C++ language that run using Unix operating systems).

Those skilled in the art will recognize that the foregoing description has been presented for the sake of illustration and description only. As such, it is not intended to be exhaustive or to limit the invention to the precise form disclosed. For example, it should be clear to those of ordinary skill in the art that all of references given above to procedural HDL statements apply equally as well to references to nodes in a control-flow-graph or control-data-flow-graph.

What is claimed is:

1. A method for logic synthesis which comprises:

analyzing an HDL model to develop a parse tree; and elaborating the parse tree to create a vector-oriented netlist;

wherein elaborating comprises vector-oriented elaborating.

2. A method for logic synthesis which comprises:

analyzing an HDL model to develop a parse tree; and elaborating the parse tree to create a word-oriented netlist;

wherein elaborating comprises word-oriented elaborating;

wherein elaborating utilizes one or more of the following data base constructs: (a) a chunk; (b) a cache; (c) a cache item; and (d) an update object.

3. A method for logic synthesis which comprises:
analyzing an HDL model to develop a parse tree; and
elaborating the parse tree to create a word-oriented netlist;
   wherein elaborating comprises word-oriented elaborating;
wherein elaborating comprises:
   preprocessing the parse tree;
   recursively traversing top-level statement objects in parse tree process objects; and
   connecting net objects in the word-oriented netlist.

4. The method of claim 3 wherein preprocessing the parse tree comprises:
   for each HDL identifier in the parse tree, creating a net object in the netlist having the same name and width as the HDL identifier; and
   for each HDL identifier in the parse tree that represents a module port, creating a full-conn object to connect the net object to a port object in accordance with the HDL model.

5. The method of claim 3 wherein recursively traversing the top-level statement objects comprises:
   a) setting "parent" and "previous" pointers of a statement object;
   b) for assignment statement, creating a net object and a conn object that connects to, and drives, the net object in the netlist, creating an update object, and updating the assignment statement's cache;
   c) for a conditional or a block statement, recursing into each sub-statement object of the statement object; and
   d) propagating cache items upward to the statement object's parent.

6. The method of claim 3 wherein creating a net object and a conn object for an assignment statement object comprises:
   (a) creating a net object in the netlist corresponding to an HDL identifier in a left-hand side of the assignment statement object having a bit-width equal to the width of the HDL identifier;
   (b) creating an update object corresponding to the HDL identifier;
   (c) updating a cache item of the assignment statement object with the contents of the update object to provide an updated chunk list;
   (d) creating a "full-conn" object in the netlist for the net object created in the netlist in step (a) above to provide a full bit-width connection to the net object;
   (e) carrying out a method, using an HDL expression and a containing HDL statement as input, for the right-hand side of the assignment statement object to create a conn object that corresponds to functionality of a given expression at a given location in the statement tree; and
   (f) creating a buffer gate object in the netlist with an output of the buffer gate object being set to the full-conn object created in step (d) above and an input of the buffer gate object being set to a conn object created in step (e) above.

7. The method of claim 6 wherein carrying out the method to create a conn object comprises:
   (a) if the HDL expression is a constant, creating a const-conn object in the netlist;
   (b) if the HDL expression is an operator, creating a structural gate object that corresponds to the operator in the netlist, and recursively returning to step (a) for sub-expressions of the operator attached to the inputs of the gate object;
   (c) if the HDL expression refers an HDL identifier, computing a chunk of the HDL identifier based on the HDL expression such that bits indicated by the HDL identifier bit-select, part-select, or full HDL identifier are represented by this chunk;
   (d) if the statement's previous pointer points to a root statement object, creating a conn-object of appropriate bit width and connecting it to the net object in the netlist that corresponds to the HDL identifier;
   (e) if the previous pointer does not point to the root statement object, examining the statement object that is pointed at by the previous pointer for a chunk of the HDL identifier by searching the cache of the statement object to see if any statement objects enclosed within the statement object assign the HDL identifier, and computing a list of chunks that represent sub-ranges of the expression chunk;
   (f) for each sub-range of the expression chunk that is assigned within this statement object, invoking a makeConnHere method.

8. The method of claim 7 wherein the makeConnHere method comprises:
   (a) for an assignment statement, creating a conn object to the net object in the netlist recorded in the assignment statement object's update object;
   (b) for a block statement object, carrying out a method to create a conn object by resetting the statement to the last statement object of the block's sub-statement objects; and
   (c) for a conditional statement, creating a multiplexor object, wherein the true branch of the conditional statement is connected to the '1' input of the multiplexor object in the netlist, the false branch of the conditional statement is connected to the '0' input of the multiplexor object in the netlist, and the condition expression in the HDL statement is connected to the selector input of the multiplexor object in the netlist; and creating and connecting a conn object for the output of the multiplexor object.

9. The method of claim 5 wherein recursing into each sub-statement object of the statement object for block statements and conditional statement objects comprises:
   (a) for block statement objects, setting the incoming previous pointer of the first sub-statement object in the block object statement to the incoming previous pointer that this block statement was called with to go to a deeper statement object;
   (b) for sub-statements after the first sub-statement object in the block statement, carrying out the steps with the incoming previous pointer set to the previous sub-statement object in the block; and
   (c) for a conditional statement object, carrying out the steps for both true and false sub-statement objects with its incoming previous pointer set to the incoming previous pointer the conditional statement was called with.

10. The method of claim 5 wherein propagating cache items upward to the statement object's parent comprises:
   merging the chunk list of each cache item in a statement object's cache with the chunk list of cache items in the cache of the statement object's cache.

11. The method of claim 3 wherein connecting net objects in the word-oriented netlist comprises:
   for each cache item in the cache of the process's root statement object:

(a) finding a net object that corresponds to the cache item's HDL identifier;
(b) creating a conn object to drive the net object;
(c) carrying out a method to create a conn object; and
(d) creating a buffer gate object.

12. A method for logic synthesis which comprises: analyzing an HDL model to develop a parse tree; and elaborating the parse tree to create a netlist utilizing chunks and update objects.

* * * * *

UNITED STATES PATENT AND TRADEMARK OFFICE
CERTIFICATE OF CORRECTION

PATENT NO.     : 6,519,755 B2
DATED          : February 11, 2003
INVENTOR(S)    : Glen R. Anderson It is certified that error appears in the above-identified patent and that said Letters Patent is hereby corrected as shown below:

Column 9,
Line 20, delete "4203" and insert -- $420_3$ --; and

Column 10,
Line 10, delete "4203" and insert -- $420_3$ --.

Signed and Sealed this

Thirtieth Day of September, 2003

JAMES E. ROGAN
*Director of the United States Patent and Trademark Office*